(12) United States Patent
Kobata et al.

(10) Patent No.: US 7,527,723 B2
(45) Date of Patent: May 5, 2009

(54) ELECTROLYTIC PROCESSING APPARATUS AND ELECTROLYTIC PROCESSING METHOD

(75) Inventors: Itsuki Kobata, Tokyo (JP); Yutaka Wada, Tokyo (JP); Hirokuni Hiyama, Fujisawa (JP); Takayuki Saito, Fujisawa (JP); Yasushi Toma, Fujisawa (JP); Tsukuru Suzuki, Fujisawa (JP); Akira Kodera, Fujisawa (JP)

(73) Assignee: Ebara Corporation, Tokyo (JP)

( * ) Notice: Subject to any disclaimer, the term of this patent is extended or adjusted under 35 U.S.C. 154(b) by 832 days.

(21) Appl. No.: 11/035,373

(22) Filed: Jan. 14, 2005

(65) Prior Publication Data

US 2005/0155868 A1 Jul. 21, 2005

(30) Foreign Application Priority Data

Jan. 16, 2004 (JP) ............................. 2004-009655
Nov. 1, 2004 (JP) ............................. 2004-318380

(51) Int. Cl.
*B23H 7/36* (2006.01)
*B23H 1/10* (2006.01)
*B23H 3/10* (2006.01)

(52) U.S. Cl. ........................ 205/668; 205/640; 205/651; 205/654; 205/660; 205/663

(58) Field of Classification Search ............. 204/224 R, 204/224 M, 297.01, 297.02, 147; 205/640, 205/651, 654, 660, 663, 668
See application file for complete search history.

(56) References Cited

U.S. PATENT DOCUMENTS

| | | | |
|---|---|---|---|
| 5,486,282 A | 1/1996 | Datta et al. | |
| 6,121,152 A | 9/2000 | Adams et al. | |
| 6,368,493 B1 | 4/2002 | Mori et al. | |
| 6,743,349 B2 | 6/2004 | Mori et al. | |
| 2001/0036746 A1 | 11/2001 | Sato et al. | |
| 2002/0033343 A1* | 3/2002 | Mori et al. | ............... 205/640 |

(Continued)

FOREIGN PATENT DOCUMENTS

EP 0 750 334 12/1996

(Continued)

OTHER PUBLICATIONS

International Application No. PCT/JP2004/010362, filed Jul. 14, 2004.

*Primary Examiner*—Bruce F Bell
(74) *Attorney, Agent, or Firm*—Wenderoth, Lind & Ponack, L.L.P.

(57) ABSTRACT

An electrolytic processing apparatus can increase the efficiency of the dissociation reaction of water and efficiently perform electrolytic processing, and can eliminate the need for an operation of a change of ion exchanger. The electrolytic processing apparatus includes: a processing electrode and a feeding electrode; a liquid supply section for supplying a liquid containing an ion-exchange material between the workpiece and at least one of the processing electrode and the feeding electrode; a power source for applying a voltage between the processing electrode and the feeding electrode; and a drive section for moving the workpiece and at least one of the processing electrode and the feeding electrode relative to each other; wherein electrolytic processing of the workpiece is carried out while keeping the workpiece not in contact with but close to the processing electrode at a distance of not more than 10 μm.

6 Claims, 16 Drawing Sheets

U.S. PATENT DOCUMENTS

| | | | |
|---|---|---|---|
| 2002/0070126 A1 | 6/2002 | Sato et al. | |
| 2004/0129569 A1* | 7/2004 | Nabeya et al. | 205/93 |
| 2005/0121328 A1* | 6/2005 | Shirakashi et al. | 205/96 |
| 2005/0155868 A1* | 7/2005 | Kobata et al. | 205/652 |
| 2006/0144711 A1* | 7/2006 | Kobata et al. | 205/82 |

FOREIGN PATENT DOCUMENTS

| | | |
|---|---|---|
| EP | 0 999 577 | 5/2000 |
| EP | 1 104 013 | 5/2001 |
| EP | 1 139 400 | 10/2001 |
| JP | 06-315830 | 11/1994 |
| JP | 1998-58236 | 3/1998 |
| JP | 2000/52235 | 2/2000 |
| JP | 2001-077117 | 3/2001 |
| WO | 00/34995 | 6/2000 |
| WO | 00/59682 | 10/2000 |
| WO | 01/52307 | 7/2001 |
| WO | 02/064314 | 8/2002 |
| WO | 02/103771 | 12/2002 |
| WO | 03/030223 | 4/2003 |
| WO | 03/046263 | 6/2003 |

* cited by examiner

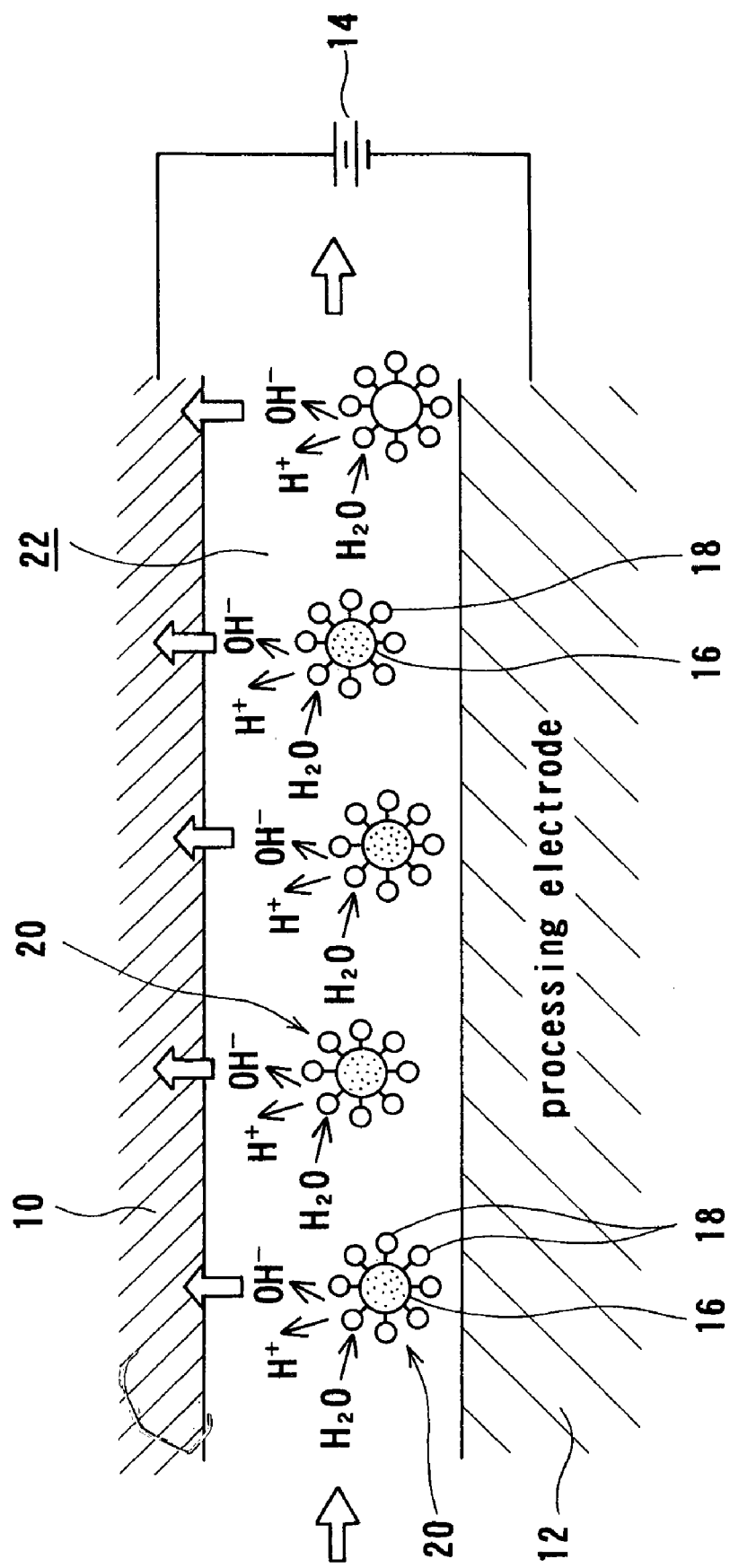

F I G. 4
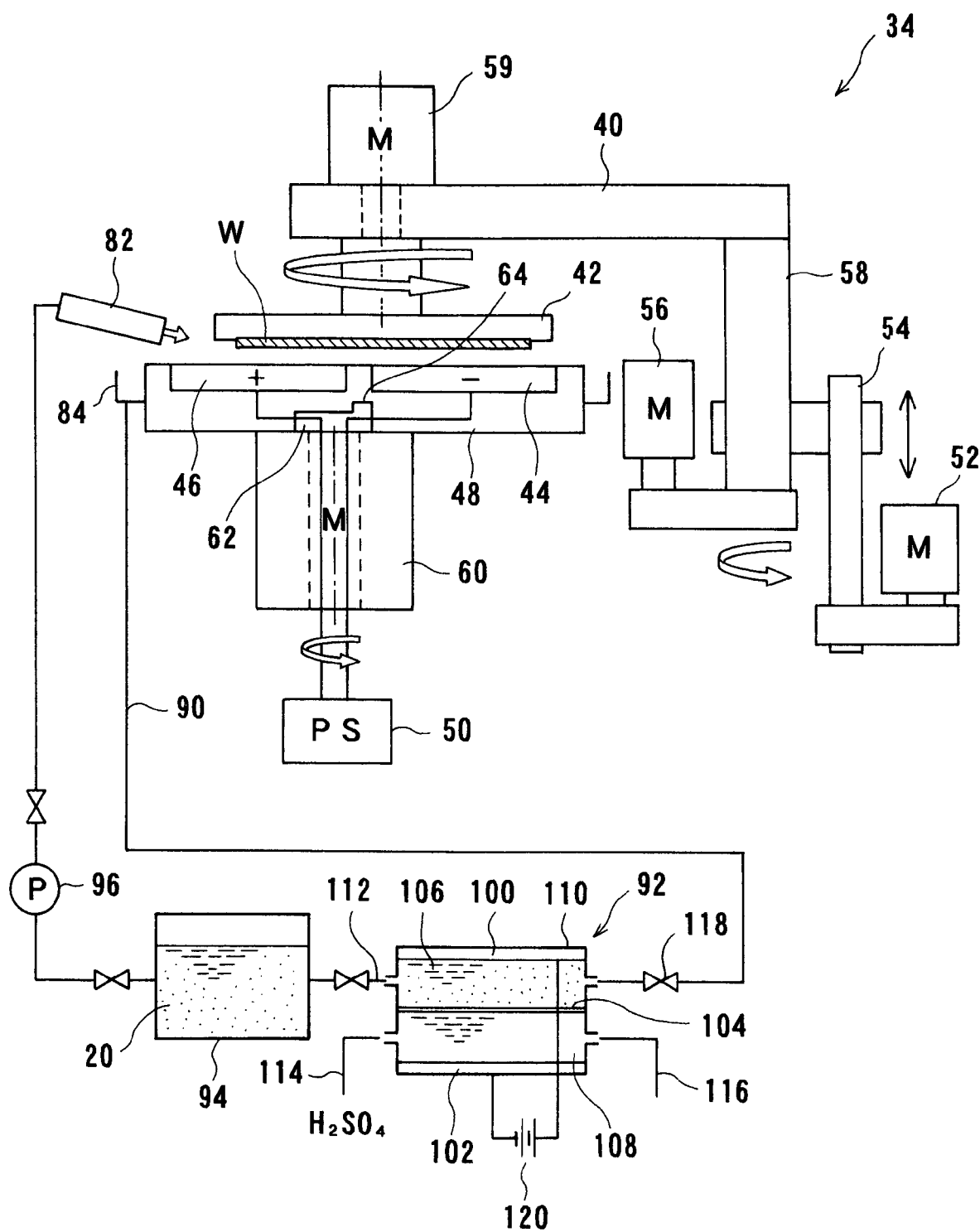

○ : distance between workpiece and electrodes=A
□ : distance between workpiece and electrodes=B
△ : distance between workpiece and electrodes=C
(A<B<C)

○ : distance between workpiece and electrodes = 1 μm
□ : distance between workpiece and electrodes = 10 μm
△ : distance between workpiece and electrodes = 50 μm
▽ : distance between workpiece and electrodes = 1 mm

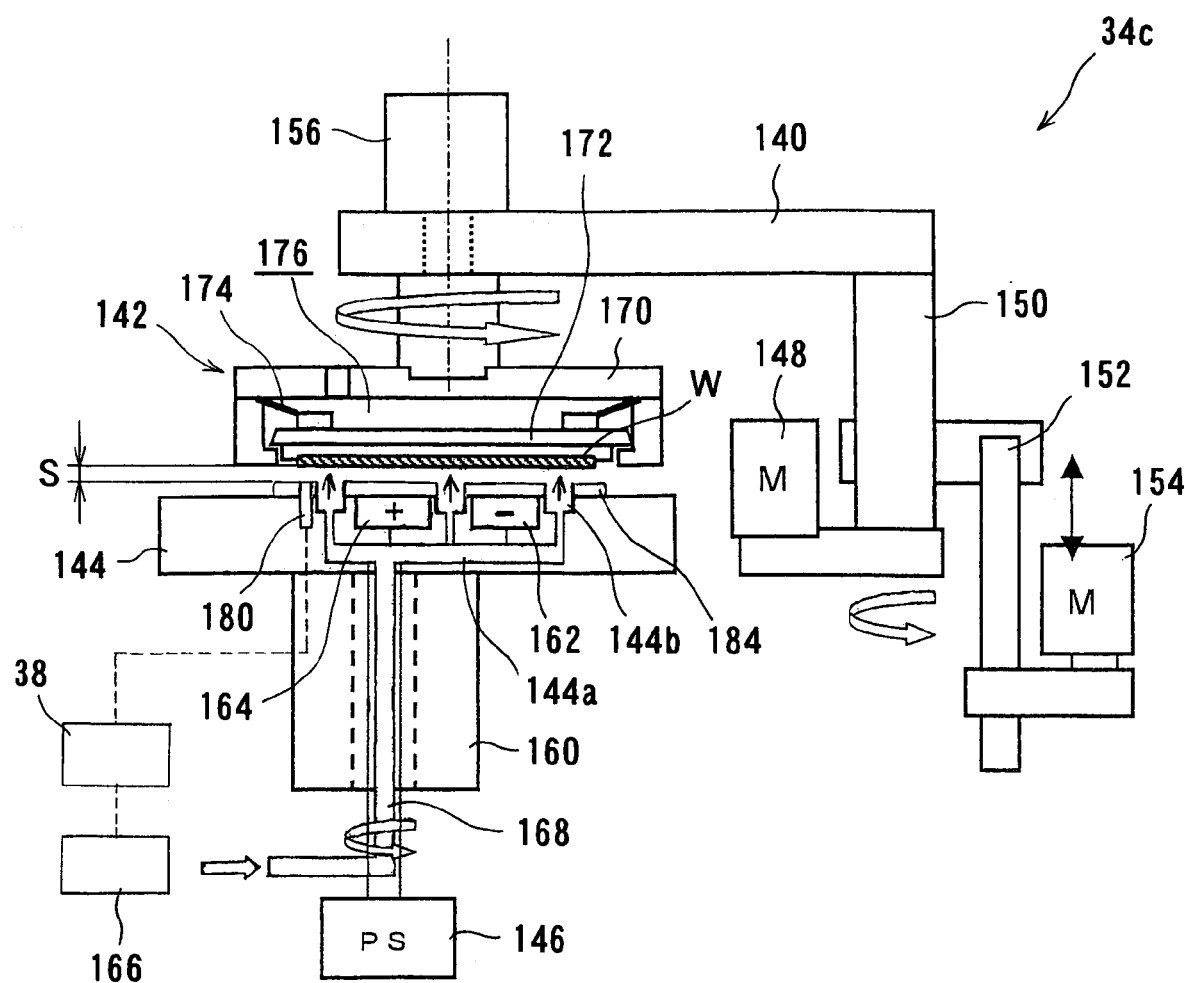
F I G. 1 5

ELECTROLYTIC PROCESSING APPARATUS AND ELECTROLYTIC PROCESSING METHOD

BACKGROUND OF THE INVENTION

1. Field of the Invention

The present invention relates to an electrolytic processing apparatus and an electrolytic processing method, and more particularly to an electrolytic processing apparatus and an electrolytic processing method useful for processing a conductive material formed in a surface of a substrate, such as a semiconductor wafer, or for removing impurities adhering to a surface of a substrate.

2. Description of the Related Art

In recent years, instead of using aluminum or aluminum alloys as a material for forming circuits on a substrate such as a semiconductor wafer, there is an eminent movement towards using copper (Cu) which has a low electric resistivity and high electromigration resistance. Copper interconnects are generally formed by filling copper into fine interconnect recesses formed in a surface of a substrate. Various techniques are known for forming such copper interconnects, including chemical vapor deposition (CVD), sputtering, and plating. According to any such technique, a copper film is formed on substantially the entire surface of a substrate, followed by removal of unnecessary copper by chemical mechanical polishing (CMP).

FIGS. 1A through 1C illustrate, in sequence of the process steps, an example of forming such a substrate W having copper interconnects. As shown in FIG. 1A, an insulating film 2, such as an oxide film of $SiO_2$ or a film of low-k material, is deposited on a conductive layer 1a in which semiconductor devices are formed, which is formed on a semiconductor base 1. Contact holes 3 and trenches 4 are formed in the insulating film 2 by performing a lithography/etching technique so as to provide interconnect recesses. Thereafter, a barrier layer 5 of TaN or the like is formed on the insulating film 2, and a seed layer 7 as an electric supply layer for electroplating is formed on the barrier layer 5 by sputtering or CVD, or the like.

Then, as shown in FIG. 1B, copper plating is performed onto the surface of the substrate W to fill the contact holes 3 and the trenches 4 with copper and, at the same time, deposit a copper film 6 on the insulating film 2. Thereafter, the copper film 6, the seed layer 7 and the barrier layer 5 on the insulating film 2 are removed by chemical mechanical polishing (CMP) so as to make the surface of the copper film 6 filled in the contact holes 3 and the trenches 4 and the surface of the insulating film 2 lie substantially on the same plane. Interconnects composed of the copper film 6 are thus formed in the insulating film 2, as shown in FIG. 1C.

Components in various types of equipments have recently become finer and have required higher accuracy. As sub-micron manufacturing technology is becoming common, the properties of materials are more and more influenced by the processing method. Under these circumstances, in such a conventional machining method that a desired portion in a workpiece is physically destroyed and removed from the surface thereof by a tool, a large number of defects may be produced to deteriorate the properties of the workpiece. Therefore, it becomes important to perform processing without deteriorating the properties of the materials.

Some processing methods, such as chemical polishing, electrolytic processing, and electrolytic polishing, have been developed in order to solve this problem. In contrast with conventional physical processing, these methods perform removal processing or the like through chemical dissolution reaction. Therefore, these methods do not suffer from defects, such as formation of a damaged layer and dislocation, due to plastic deformation, so that processing can be performed without deteriorating the properties of the materials.

In the case of the above-mentioned conventional electrolytic processing or electrolytic polishing, the process proceeds through an electrochemical interaction between a workpiece and an electrolytic solution (aqueous solution of NaCl, $NaNO_3$, HF, HCl, $HNO_3$, NaOH, etc.). Since an electrolytic solution containing such an electrolyte must be used, contamination of a workpiece with the electrolyte cannot be avoided.

Further, a method has been reported which performs CMP processing simultaneously with plating, viz. chemical mechanical electrolytic polishing. According to this method, the mechanical processing is carried out to the growing surface of a plated film, causing the problem of denaturing of the resulting film.

Electrolytic metal processing methods, which are improved in environmental burden, contamination of a processed product, safety in operation, etc., have recently been developed (see Japanese Patent Laid-Open Publication Nos. 2000-52235 and 2001-64799). These electrolytic processing methods use pure water or ultrapure water in carrying out electrolytic processing. Since pure water or ultrapure water hardly passes electricity therethrough, the processing methods use an ion exchanger disposed between a workpiece and a processing electrode to carry out electrolytic processing of the workpiece. Since the workpiece, the ion exchanger and the processing electrode are all put in a pure water or ultrapure water atmosphere, the environmental burden problem and the workpiece contamination problem can be remarkably reduced. Further, metal to be processed is removed as metal ions through the electrolytic reaction, and the dissolved ions are held in the ion exchanger. This can further reduce contamination of the workpiece and the liquid (pure water or ultrapure water) itself. Such a processing method, therefore, is considered to be an ideal electrolytic processing method.

As described above, according to the electrolytic processing method which processes a workpiece by using an ion exchanger and supplying ultrapure water, contamination of the workpiece can be prevented and the environmental burden can be remarkably reduced. Further, the electrolytic processing method can provide various metal parts with a specular gloss surface, and can also eliminate the use of a cutting oil, a slurry containing a polishing agent, an electrolyte solution, etc. which are necessary to the conventional mechanical metal processing or finishing methods.

Chemical mechanical polishing (CMP), for example, generally necessitates a complicated operation and control, and needs a considerably long processing time. In addition, a sufficient cleaning of a polished surface must be conducted after the polishing treatment. This also imposes a considerable load on the slurry or cleaning liquid waste disposal. Accordingly, there is a strong demand for omitting CMP entirely or reducing a load upon CMP. Also in this connection, it is to be pointed out that though a low-k material, which has a low dielectric constant, is expected to be predominantly used in the future as a material for the insulating film (inter-level dielectric layer), the low-k material has a low mechanical strength and therefore it is difficult for it to endure the stress applied during CMP processing. Thus, also from this standpoint, there is a demand for a process that enables the flattening of a substrate without giving any stress thereto.

In order to solve these problems, a method has been proposed in which electrolytic processing of a workpiece is carried out by using a liquid having a high electric resistance, such as pure water or ultrapure water, as an electrolyte solution and providing, according to necessity, an ion exchanger, which promotes the dissociation reaction of water molecules in the liquid into hydroxide ions and hydrogen ions, between an electrode and the workpiece, thereby eliminating a mechanical stress on the workpiece and facilitating post-cleaning (see Japanese Patent Laid-Open Publication No. 2003-145354).

There are also proposed a method in which electrolytic processing (etching) of a workpiece with an electrolytic solution is carried out while keeping the distance between the workpiece and an opposing electrode not more than 10 μm, for example 1 μm, thereby improving the surface flatness of the workpiece after processing (see Japanese Patent Laid-Open Publication No. 2001-102356), and a method in which electrolytic processing of a wafer (substrate) with an electrolytic solution is carried out while keeping the distance between a platen electrode and the wafer not more than 1 mm, preferably 2000 Å and keeping a polishing pad (thickness of about 200 Å), interposed between the platen electrode and the wafer, in contact with the wafer surface to polish the wafer surface (WO No. 02/064314).

In electrolytic processing using an ion exchanger, the ion exchanger is fixedly disposed between a workpiece and at least one of a processing electrode and a feeding electrode, thereby promoting the dissociation reaction of water and supplying $OH^-$ ions or $H^+$ ions generated to the surface of the workpiece to effect processing thereof. Ion exchangers in different forms have different degrees of water permeability. When an ion exchanger having poor water permeability is used, for example, the supply of water to between a workpiece and an electrode (processing electrode or feeding electrode) is restricted. The supply of water to the ion exchanger may therefore be insufficient, resulting in a low water decomposition efficiency and thus an insufficient supply of $OH^-$ ions or $H^+$ ions as reaction species. Further, the efficiency of removal of processing products and gasses generated at the surfaces of the workpiece and the electrode during processing will be low. This may result in deterioration of the morphology of the processed surface.

A processing product, which will affect the processing, gradually accumulates in an ion exchanger with the progress of processing. A method to solve this problem is to electrically remove the processing product accumulated in the ion exchanger. This method, however, is not a permanent solution yet. The ion exchanger, therefore, needs to be finally changed for a new one. During the change of the ion exchanger, the apparatus must be stopped, leading to a lowering of the throughput.

There is, therefore, a demand for the development of an electrolytic processing apparatus and method that satisfies the requirements of (1) an increased amount of water supply to an ion exchanger, (2) efficient removal of processing products and gasses generated upon processing and (3) ease of a change of ion exchanger.

In electrolytic processing using an electrolyte solution to remove an unnecessary portion of a conductive film having surface irregularities, for example, the copper film 6 embedded in trenches shown in FIG. 1B, formed on a substrate such as a semiconductor wafer, difficulty in flattening the surface irregularities of the conductive film is a typical problem involved in such processing. This difficulty is ascribable to the fact that an appropriate difference in processing rate between recessed portions and raised portions of the surface irregularities of a conductive film formed on a substrate cannot be produced due to (1) the distance between the substrate and an electrode being much larger than the surface level difference of the conductive film formed on the substrate and (2) low electric resistivity of electrolyte solution. Further, in the case of interposing an ion exchanger between a workpiece, especially a substrate, and an electrode, electrolytic processing is generally carried out while sliding the ion exchanger on the surface of the workpiece. The sliding movement between the ion exchanger and the workpiece can produce defects in the surface of the workpiece and wear the ion exchanger. Solving these problems is therefore required in applying electrolytic processing to removal of a conductive film provided on a substrate, such as a semiconductor wafer.

SUMMARY OF THE INVENTION

The present invention has been made in view of the above situation in the related art. It is therefore a first object of the present invention to provide an electrolytic processing apparatus and an electrolytic processing method which can increase the efficiency of the dissociation reaction of water and efficiently perform electrolytic processing, and which can eliminate the need for an operation of a change of ion exchanger.

It is a second object of the present invention to provide an electrolytic processing apparatus and an electrolytic processing method which can process a surface of a workpiece to greater flatness while minimizing contamination of the surface of the workpiece as well as defects in the surface.

In order to solve the above objects, the present invention provides an electrolytic processing apparatus comprising: a processing electrode capable of coming close to a workpiece; a feeding electrode for feeding electricity to the workpiece; a liquid supply section for supplying a liquid containing an ion-exchange material between the workpiece and at least one of the processing electrode and the feeding electrode, said ion-exchange material having a smaller size than the distance between the substrate and said at least one of the processing electrode and the feeding electrode; a power source for applying a voltage between the processing electrode and the feeding electrode; and a drive section for moving the workpiece and at least one of the processing electrode and the feeding electrode relative to each other; wherein electrolytic processing of the workpiece is carried out while keeping the workpiece not in contact with and close to the processing electrode at a distance of not more than 10 μm.

FIG. 2 illustrates the mechanism of electrolytic processing according to the present invention. In FIG. 2 is shown the processing system in which a workpiece 10 and a processing electrode 12 are provided close to each other, and a liquid 22 containing an ion-exchange material 20 which comprises a base material 16 having a surface ion-exchange group 18, is continuously supplied between the workpiece 10 and the processing electrode 12 while applying a voltage therebetween from a power source 14. Instead of the base material 16 having the surface ion-exchange group 18, it is also possible to use a base material internally having an ion-exchange group.

Water molecules $H_2O$ in the liquid 22, such as ultrapure water, are dissociated into hydroxide ions $OH^-$ and hydrogen ions $H^+$ by the ion-exchange groups 18 and, by the electric field between the workpiece 10 and the processing electrode 12 and also by the flow of the liquid 22 such as ultrapure water, the hydroxide ions $OH^-$ generated, for example, are supplied to the surface, facing the processing electrode 12, of the workpiece 10 so as to increase the density of hydroxide ions $OH^-$ in the vicinity of the workpiece 10 and cause the hydroxide ions $OH^-$ to react with the atoms of the workpiece 10. The reaction product produced by the reaction is dissolved in the liquid 22 or taken in the ion-exchange groups 18 of the ion-exchange material 20, and is removed from the workpiece 10 by the flow of the liquid 22, such as ultrapure water, flowing along the surface of the workpiece 10. Removal processing of the surface layer of the workpiece 10 is thus effected.

This processing method performs removal processing of a workpiece solely by the dissolution reaction based on the electrochemical interaction, as distinct from a CMP method that performs processing by the combination of the physical interaction between a polishing member and a workpiece, and the chemical interaction between a chemical species in a polishing liquid and the workpiece. Therefore, removal processing of a material can be performed without impairing the properties of the material. Even when the material is of a low mechanical strength, such as a low-k material, removal processing of the material can be effected without causing any physical interaction. Further, as compared to conventional electrolytic processing apparatuses, the apparatus of the present invention, because of the use as an electrolyte solution of a liquid having an electric conductivity of not more than 500 μS/cm, preferably pure water, more preferably ultrapure water, can remarkably reduce contamination of the surface of a workpiece with impurities and can facilitate disposal of waste liquid after the processing.

According to the present invention, electrolytic processing of a workpiece is carried out while supplying a liquid containing an ion-exchange material between the workpiece and a processing electrode and/or a feeding electrode. This allows plenty of water to be present around the ion-exchange material, thereby increasing the efficiency of the dissociation reaction of water. Further, a large amount of liquid can be supplied between the workpiece and the processing electrode and/or the feeding electrode, enabling electrolytic processing to be carried out efficiently.

In addition, electrolytic processing is carried out while keeping the workpiece not in contact with and close to the processing electrode at a distance of not more than 10 μm. This can decrease the ratio of the distance between the processing electrode and the top of a raised portion of a conductive film formed on a substrate, such as a semiconductor wafer, to the surface level difference (e.g. 200 nm) of the conductive film, enabling preferential processing of the top of the raised portion of the conductive film. This can provide the processed surface of the conductive film with improved flatness. From the viewpoint of eliminating the surface level differences of the conductive film, the distance between the workpiece and the processing electrode is preferably as small as possible, for example, on the order of several hundred nm to several μm, though the distance must not be made zero, i.e., contact between them must be avoided.

The ion-exchange material is contained in the liquid generally in an amount of 1 to 90% by weight.

The ion-exchange material may be present in a particulate or gel-like form in the liquid and is contained in the liquid generally in an amount of 1 to 90% by weight, with 1 to 50% by weight being preferred. The use of a large amount of ion-exchange material promotes the ion dissociation of water to thereby increase the rate of $OH^-$ generation, thus increasing the current density between the processing electrode and the workpiece, and increasing the processing rate that is proportional to the current density. If the amount of the ion-exchange material relative to the amount of water is too large, however, water as the object of ion exchange will run short whereby the generation of $OH^-$ will be limited to a certain extent, which could rather decrease the current density.

Accordingly, the content of the ion-exchange material in the liquid is generally 1 to 90% by weight, preferably 1 to 50% by weight.

Preferably, the ion-exchange material has such a size that it can smoothly pass through the space between the workpiece and the processing electrode.

This can prevent the ion-exchange material from not entering the space between the workpiece and the processing electrode and/or the feeding electrode, and can also prevent the ion-exchange material from being squeezed into the space and thereby damaging the surface of the workpiece. The size (diameter) of the particulate ion-exchange material is smaller than the distance between the workpiece and the processing electrode which may be of the order of several hundred nm to several μm, and is preferably not larger than 1/10 of the distance between the workpiece and the processing electrode, for example.

Preferably, the liquid is ultrapure water, pure water, a liquid having an electric conductivity of not more than 500 μS/cm, or an electrolyte solution.

Ultrapure water herein refers to water having an electric conductivity (at 25° C., 1 atm.) of not more than 0.1 μS/cm, and pure water refers to water having an electric conductivity of not more than 10 μS/cm. The use of ultrapure water or pure water in carrying out electrolytic processing enables clean processing without leaving impurities on the processed surface, whereby cleaning after the electrolytic processing can be simplified. Thus, one-step or two-step cleaning may suffice after the electrolytic processing. Further, the electric resistance between the processing electrode and the bottom of a recessed portion in the surface of a conductive film formed on a substrate, such as a semiconductor wafer, can be made further larger than the electric resistance between the processing electrode and the top of a raised portion of the conductive film, thereby increasing the effect of flattening the surface of the conductive film.

Further, it is also possible to use a liquid obtained, for example, by adding an additive, such as a surfactant or the like, to pure water or ultrapure water, and having an electric conductivity of not more than 500 μS/cm, preferably not more than 50 μS/cm, more preferably not more than 0.1 μS/cm (resistivity of not less than 10 MΩ·cm). This also makes it possible to make the electric resistance between the processing electrode and the bottom of a recessed portion in the surface of a conductive film formed on a substrate, such as a semiconductor wafer, further larger than the electric resistance between the processing electrode and the top of a raised portion of the conductive film, thereby increasing the effect of flattening the surface of the conductive film.

The additive acts to prevent local concentration of ions (e.g. hydroxide ions ($OH^-$ ions)). In this regard, it is noted that "an equal removal processing rate at every points in the entire processing surface" is an important factor for providing a flat processed surface. When a single electrochemical removal reaction is in progress, a local difference in the removal processing rate may be produced by a local concentration of reactant species. The local concentration of reactant species may be mainly caused by a local variation in the electric field intensity between the processing electrode and the feeding electrode and a variation in the distribution of reactant ions as reactant species in the vicinity of the surface of the workpiece. The local concentration of ions can be prevented by adding an additive, which acts to prevent local concentration of ions (e.g. hydroxide ions), to the liquid.

A solution of a neutral salt such as NaCl or $Na_2SO_4$, a solution of an acid such as HCl or $H_2SO_4$, or a solution of an alkali such as ammonia, may be used as the electrolytic solution, and these solutions may be selectively used according to the properties of the workpiece.

In a preferred embodiment of the present invention, the electrolytic processing apparatus further comprises a regeneration section for removing a processing product, which has been taken in the ion-exchange material during processing, from the ion-exchange material.

By removing a processing product which has been taken in the ion-exchange material contained in the liquid during processing from the ion-exchange material to thereby regenerate the ion-exchange material, it becomes possible to eliminate an operation of a change of ion exchanger (ion-exchange material) as is necessary, for example, to an electrolytic processing apparatus that employs a fixed ion exchanger.

The regeneration section may be adapted to separate the ion-exchange material from the liquid, and disperse the separated ion-exchange material in a regeneration liquid, thereby removing the processing product taken in the ion-exchange material.

Alternatively, the regeneration section may be adapted to receive the liquid containing the ion-exchange material in a regeneration tank, and apply an electric field to the liquid in the regeneration tank, thereby removing the processing product taken in the ion-exchange material.

The present invention also provides an electrolytic processing method comprising: disposing a workpiece, to which electricity is fed from a feeding electrode, and a processing electrode such that they are not in contact with and close to each other at a distance of not more than 10 µm; supplying a liquid containing an ion-exchange material between the workpiece and at least one of the processing electrode and the feeding electrode, said ion-exchange material having a smaller size than the distance between the workpiece and said at least one of the processing electrode and the feeding electrode; applying a voltage between the processing electrode and the feeding electrode; and moving the workpiece and at least one of the processing electrode and the feeding electrode relative to each other.

The present invention also provides another electrolytic processing apparatus comprising: a processing electrode capable of coming close to a workpiece; a feeding electrode for feeding electricity to the workpiece; a power source for applying a voltage between the processing electrode and the feeding electrode; a drive section for moving the workpiece and at least one of the processing electrode and the feeding electrode relative to each other; a liquid supply section for supplying a liquid between the workpiece and at least one of the processing electrode and the feeding electrode; a detector for detecting the distance between the workpiece and at least one of the processing electrode and the feeding electrode; and a control section for controlling, based on a signal from the detector, the distance between the workpiece and at least one of the processing electrode and the feeding electrode at a predetermined value which is not more than 100 µm and at which they are not in contact.

According to the present invention, in a preferred embodiment thereof, electrolytic processing of a workpiece, for example, a substrate such as a semiconductor wafer, is carried out while controlling the distance between the workpiece and at least one of the processing electrode and the feeding electrode at a predetermined value which is not more than 100 µm and at which they are not in contact. According to this method, even when a conductive film formed on the substrate, such as a semiconductor wafer, has surface irregularities of the level difference of e.g. about 200 nm, it becomes possible to produce a difference in electrical resistance and thus a difference in processing rate between a raised portion and a recessed portion of the irregularities so that the surface irregularities can be processed into a flat processed surface. The distance between the workpiece and at least one of the processing electrode and the feeding electrode is preferably not more than 50 µm, more preferably not more than 10 µm, and most preferably not more than 1 µm.

An optical (reflection) or eddy current-type distance sensor may be used as the detector for detecting the distance between the workpiece and at least one of the processing electrode and the feeding electrode. In case the electrolytic processing apparatus is provided with an end point sensor for detecting the end point of electrolytic processing, the end point sensor may be employed also as the distance detector. Thus, in this case, the thickness of a conductive film, etc. and the distance between the workpiece and at least one of the processing electrode and the feeding electrode can be measured simultaneously with the single sensor (end point sensor).

The present invention also provides still another electrolytic processing apparatus comprising: a processing electrode capable of coming close to a workpiece; a feeding electrode for feeding electricity to the workpiece; a power source for applying a voltage between the processing electrode and the feeding electrode; a drive section for moving the workpiece and at least one of the processing electrode and the feeding electrode relative to each other; a liquid supply section for supplying a liquid between the workpiece and at least one of the processing electrode and the feeding electrode; an ion exchanger disposed between the workpiece and at least one of the processing electrode and the feeding electrode; a detector for detecting the distance between the workpiece and the ion exchanger; and a control section for controlling, based on a signal from the detector, the distance between the workpiece and the ion exchanger at a predetermined value which is not more than 100 µm and at which they are not in contact.

The provision of an ion exchanger can promote the dissociation reaction of water molecules in the liquid into hydroxide ions and hydrogen ions. Further, electrolytic processing of a workpiece, for example, a substrate such as a semiconductor wafer, is carried out while controlling the distance between the workpiece and the ion exchanger at a predetermined value which is not more than 100 µm and at which they are not in contact. According to this method, even when a conductive film formed on the substrate, such as a semiconductor wafer, has surface irregularities of the level difference of e.g. about 200 nm, it becomes possible to produce a difference in electrical resistance and thus a difference in processing rate between a raised portion and a recessed portion of the irregularities so that the surface irregularities can be processed into a flat surface. Further, since electrolytic processing is carried out without sliding between the ion exchanger and the surface of the workpiece, defects in the surface of the workpiece and wear of the ion exchanger can be prevented. The distance between the workpiece and the ion exchanger is preferably not more than 50 µm, more preferably not more than 10 µm, most preferably not more than 1 µm.

Preferably, the electrolytic processing apparatus further comprises a holder for floatingly supporting the workpiece such that the workpiece can move closer to and away from at least one of the processing electrode and the feeding electrode.

The provision of the holder makes it possible to easily move the workpiece closer to or away from at least one of the processing electrode and the feeding electrode in response to the degree of a force applied by the liquid to the workpiece upon electrolytic processing, thereby adjusting the distance between the workpiece and at least one of the processing electrode and the feeding electrode.

Preferably, the control section controls at least one of the pressure of the liquid supplied between the workpiece and at least one of the processing electrode and the feeding electrode, the relative speed between the workpiece and at least one of the processing electrode and the feeding electrode, and the voltage applied between the processing electrode and the feeding electrode.

The liquid force (dynamic pressure), which is caused by a relative movement between the workpiece and at least one of the processing electrode and the feeding electrode, can be controlled by controlling the relative speed between them. Thus, the degree of the force applied by the liquid to the workpiece upon electrolytic processing can be controlled by controlling the relative speed.

When electrolytic processing is carried out by the electrolytic processing apparatus provided with an ion exchanger, an attraction force acts between the workpiece and the ion exchanger, and the attraction force is influenced by the voltage applied between the processing electrode and the feeding electrode. Accordingly, by controlling the voltage applied between the processing electrode and the feeding electrode, the distance between the workpiece and the ion exchanger can be controlled through the attraction force acting between them.

The present invention also provides still another electrolytic processing apparatus comprising: a processing electrode capable of coming close to a workpiece; a feeding electrode for feeding electricity to the workpiece; a power source for applying a voltage between the processing electrode and the feeding electrode; a drive section for moving the workpiece and at least one of the processing electrode and the feeding electrode relative to each other; a liquid supply section for supplying a liquid between the workpiece and at least one of the processing electrode and the feeding electrode; and an insulating spacer having a thickness of not more than 100 $\mu$m disposed between the workpiece and at least one of the processing electrode and the feeding electrode.

By interposing the insulating spacer having a thickness of not more than 100 $\mu$m between the workpiece and at least one of the processing electrode and the feeding electrode, the distance between the workpiece and at least one of the processing electrode and the feeding electrode can be set at a non-contact distance of not more than 100 $\mu$m. The thickness of the insulating spacer is preferably not more than 50 $\mu$m, more preferably not more than 10 $\mu$m and most preferably not more than 1 $\mu$m.

The present invention also provides still another electrolytic processing apparatus comprising: a processing electrode capable of coming close to a workpiece; a feeding electrode for feeding electricity to the workpiece; a power source for applying a voltage between the processing electrode and the feeding electrode; a drive section for moving the workpiece and at least one of the processing electrode and the feeding electrode relative to each other; a liquid supply section for supplying a liquid between the workpiece and at least one of the processing electrode and the feeding electrode; an ion exchanger disposed between the workpiece and at least one of the processing electrode and the feeding electrode; and an insulating spacer having a thickness of not more than 100 $\mu$m disposed between the workpiece and the ion exchanger.

By interposing the insulating spacer having a thickness of not more than 100 $\mu$m between the workpiece and the ion exchanger disposed between the workpiece and at least one of the processing electrode and the feeding electrode, the distance between the ion exchanger and the workpiece can be set at a non-contact distance of not more than 100 $\mu$m.

The insulating spacer is preferably formed of a porous material.

This ensures water permeability of the insulating spacer, so that the liquid can flow through the insulating spacer.

Preferably, the liquid supply section supplies the liquid between the workpiece and at least one of the processing electrode and the feeding electrode from the side and/or in the direction in which a flow of the liquid is directed against the workpiece.

The liquid is preferably ultrapure water, pure water or a liquid having an electric conductivity of not more than 500 $\mu$S/cm. When a liquid having a high electric conductivity is used, though the resistance ratio, corresponding to distance ratio, is the same irrespective of the electric conductivity, the resistance per se of the liquid is small. Accordingly, the resistance difference between a recessed portion and a raised portion of a conductive film having surface irregularities is small, leading to poor irregularities selectivity in electrolytic processing. When ultrapure water or pure water is used, on the other hand, the resistance difference due to the distance difference is large, leading to good irregularities selectivity in electrolytic processing. It is therefore desirable to use as the liquid ultrapure water, pure water or a liquid having an electric conductivity of not more than 500 $\mu$S/cm.

The present invention also provides another electrolytic processing method comprising: providing a processing electrode capable of coming close to a workpiece, and a feeding electrode for feeding electricity to the workpiece; moving the workpiece and at least one of the processing electrode and the feeding electrode relative to each other in the presence of a liquid while keeping the distance between the workpiece and at least one of the processing electrode and the feeding electrode at a predetermined value which is not more than 100 $\mu$m and at which they are not in contact; and applying a voltage between the processing electrode and the feeding electrode.

Preferably, the distance between the workpiece and at least one of the processing electrode and the feeding electrode is kept at a predetermined value which is not more than 100 $\mu$m and at which they are not in contact by the pressure of the liquid supplied between the workpiece and at least one of the processing electrode and the feeding electrode.

Alternatively, the distance between the workpiece and at least one of the processing electrode and the feeding electrode may be kept at a predetermined value which is not more than 100 $\mu$m and at which they are not in contact by the pressure of the liquid generated by the relative movement between the workpiece and at least one of the processing electrode and the feeding electrode.

The present invention also provides still another electrolytic processing method comprising: providing a processing electrode capable of coming close to a workpiece, and a feeding electrode for feeding electricity to the workpiece; disposing an ion exchanger between the workpiece and at least one of the processing electrode and the feeding electrode; moving the workpiece and at least one of the processing electrode and the feeding electrode relative to each other in the presence of a liquid while keeping the distance between the workpiece and the ion exchanger at a predetermined value which is not more than 100 $\mu$m and at which they are not in contact; and applying a voltage between the processing electrode and the feeding electrode.

Preferably, the distance between the workpiece and the ion exchanger is kept at a predetermined value which is not more than 100 $\mu$m and at which they are not in contact by the pressure of the liquid supplied between the workpiece and at least one of the processing electrode and the feeding electrode.

Alternatively, the distance between the workpiece and the ion changer may be kept at a predetermined value which is not more than 100 μm and at which they are not in contact by the pressure of the liquid generated by the relative movement between the workpiece and at least one of the processing electrode and the feeding electrode.

The relative movement is, for example, a rotational movement, a translational movement, a linear movement, a scroll movement or a reciprocating movement, or a combination thereof, and the relative speed is generally not less than 0.1 m/s.

The relative speed is generally not less than 0.1 m/s, preferably not less than 1 m/s, and more preferably not less than 2 m/s.

The present invention also provides still another electrolytic processing method comprising: providing a processing electrode capable of coming close to a workpiece, and a feeding electrode for feeding electricity to the workpiece; disposing an insulating spacer having a thickness of not more than 100 μm between the workpiece and at least one of the processing electrode and the feeding electrode; moving the workpiece and at least one of the processing electrode and the feeding electrode relative to each other in the presence of a liquid while keeping them in contact with the insulating spacer; and applying a voltage between the processing electrode and the feeding electrode.

The present invention also provides still another electrolytic processing method comprising: providing a processing electrode capable of coming close to a workpiece, and a feeding electrode for feeding electricity to the workpiece; disposing an ion exchanger between the workpiece and at least one of the processing electrode and the feeding electrode; disposing an insulating spacer having a thickness of not more than 100 μm, which is in contact with the ion exchanger, between the workpiece and the ion exchanger; moving the workpiece and at least one of the processing electrode and the feeding electrode relative to each other in the presence of a liquid while keeping the workpiece in contact with the insulating spacer and keeping said at least one of the processing electrode and the feeding electrode in contact with the ion exchanger; and applying a voltage between the processing electrode and the feeding electrode.

BRIEF DESCRIPTION OF THE DRAWINGS

FIG. 2 is a diagram illustrating the mechanism of electrolytic processing carried out by supplying a liquid containing an ion-exchange material between a processing electrode and a workpiece;

FIG. 4 is a vertical sectional view schematically showing the electrolytic processing apparatus shown in FIG. 3;

FIG. 15 is a vertical sectional front view schematically showing an electrolytic processing apparatus according to yet another embodiment of the present invention;

DETAILED DESCRIPTION OF THE PREFERRED EMBODIMENTS

Preferred embodiments of the present invention will now be described in detail with reference to the drawings. Though the following description illustrates the case of removing a thin film (conductive film), such as a copper film, formed on a surface of a substrate as a workpiece, the present invention is of course applicable to workpieces other than a substrate.

Figure 1A:
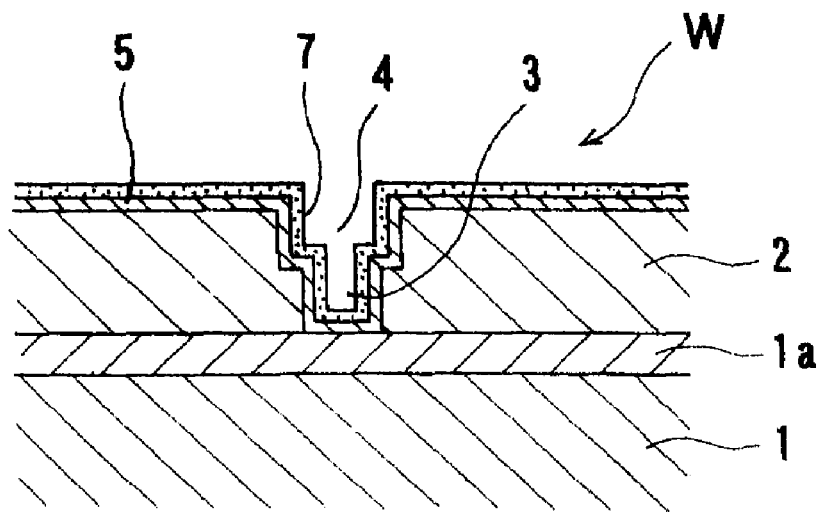
FIGS. 1A through 1C are diagrams illustrating, in sequence of process steps, a process for the production of a substrate having copper interconnects.
Figure 1B:
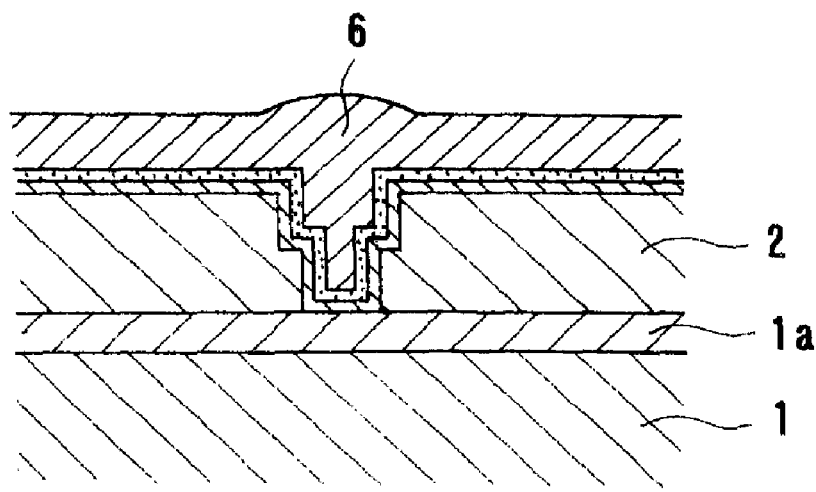
Figure 1C:
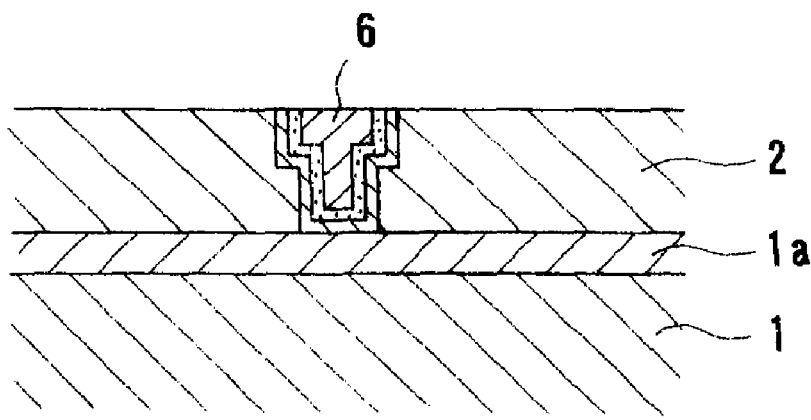
Figure 3:
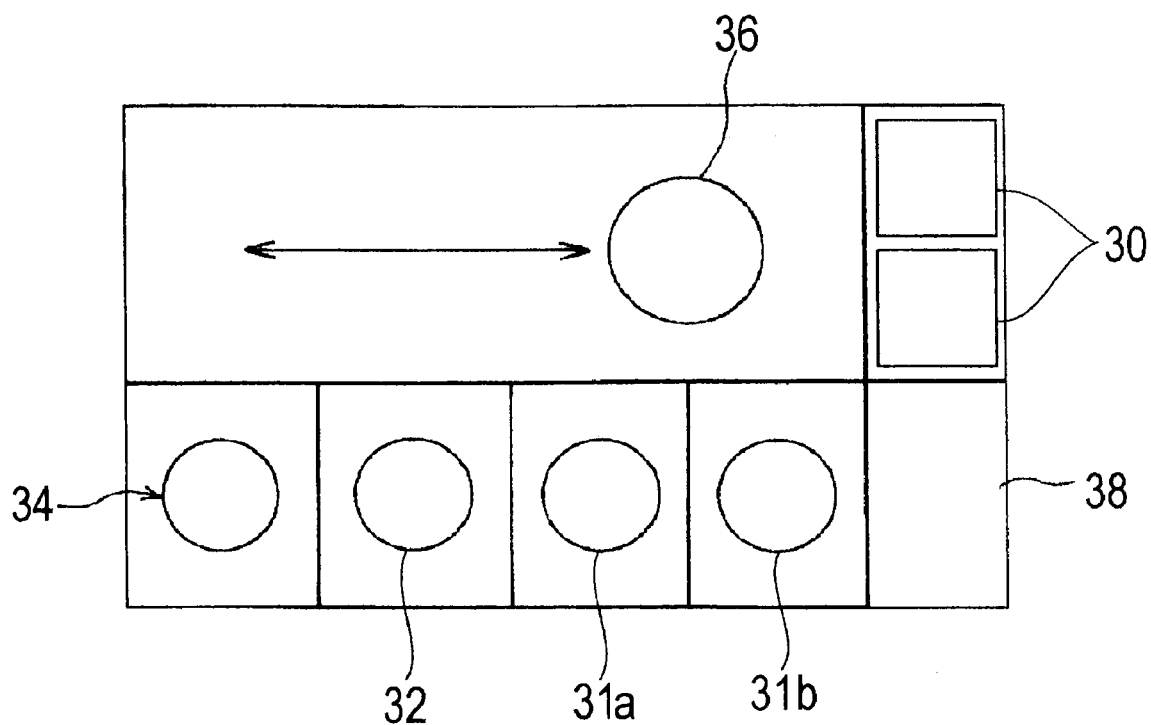
FIG. 3 is a plan view showing the construction of a substrate processing apparatus incorporating an electrolytic processing apparatus according to an embodiment of the present invention.

FIG. 3 is a plan view illustrating the construction of a substrate processing apparatus incorporating an electrolytic processing apparatus according to an embodiment of the present invention. As shown in FIG. 3, the substrate processing apparatus comprises a pair of loading/unloading section 30 as a carry-in/carry-out section for carrying in and out a substrate, e.g. a substrate W having a copper film 6 and a barrier layer as a conductive film (portion to be processed) thereon, as shown in FIG. 1B, a first cleaning machine 31$a$ for performing a primary cleaning of the substrate, a second cleaning machine 31$b$ for performing a secondary cleaning (finish cleaning) of the substrate, a reversing machine 32 for reversing the substrate, and an electrolytic processing apparatus 34. These devices are disposed in series. A transport robot 36 as a transport device, which can move parallel to these devices for transporting and transferring the substrate W therebetween, is provided. The substrate processing apparatus is also provided with a control section 38, disposed adjacent to the loading/unloading units 30, for controlling the electrolytic processing apparatus 34.

Figure 5:
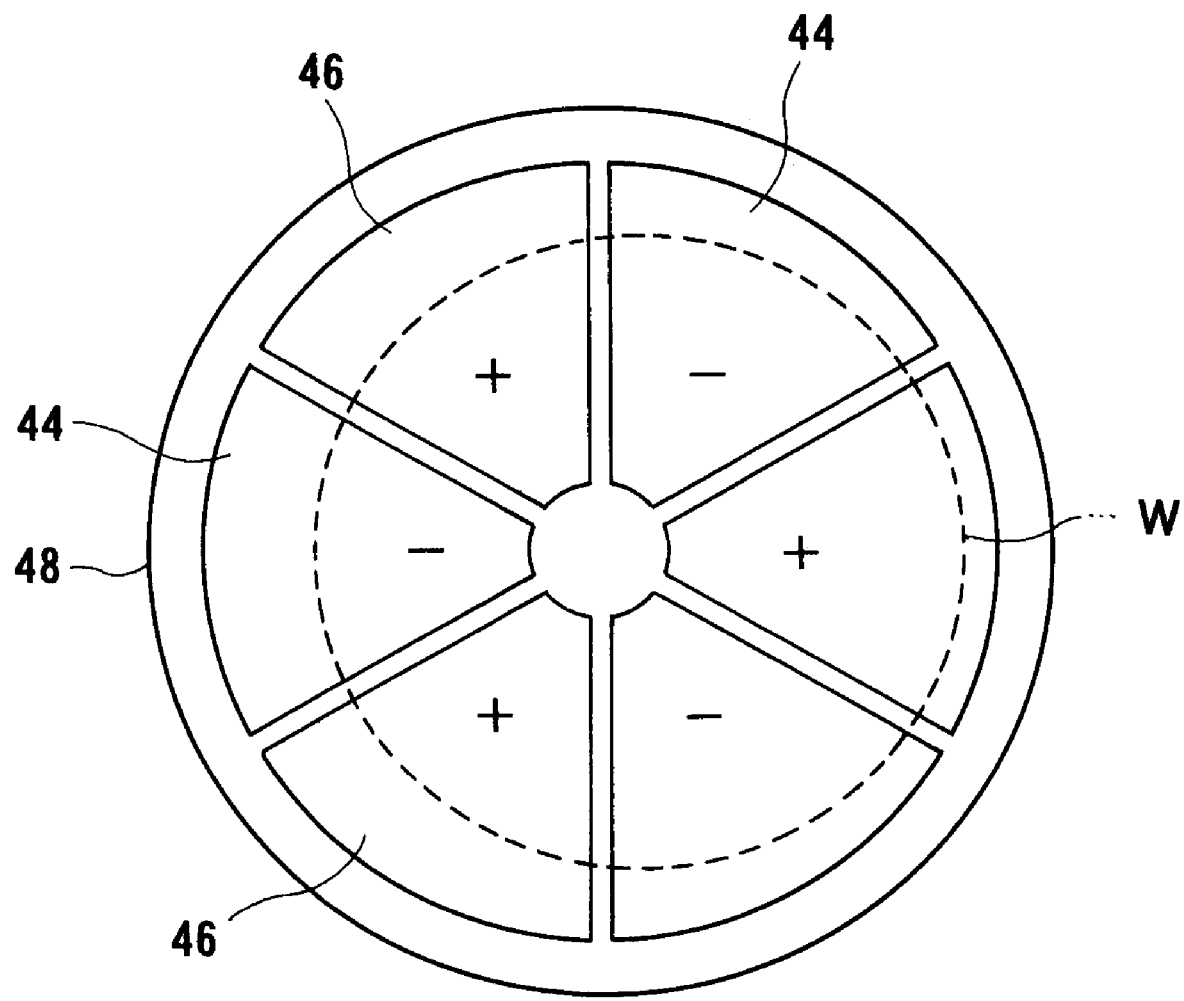
FIG. 5 is a plan view of the electrode section of the electrolytic processing apparatus shown in FIG. 4.

FIG. 4 is a vertical sectional view showing the electrolytic processing apparatus 34 in the substrate processing apparatus, and FIG. 5 is a plan view of an electrode section of the electrolytic processing apparatus 34. As shown in FIGS. 4 and 5, the electrolytic processing apparatus 34 includes a pivot arm 40 that can move vertically and pivot horizontally, a substrate holder 42, supported at the free end of the pivot arm 40, for attracting and holding the substrate W with its front surface facing downward (face-down), and, disposed below the substrate holder 42, a disc-shaped electrode section 48 made of an insulating material. The electrode section 48 has, embedded therein, fan-shaped processing electrodes 44 and feeding electrodes 46 that are disposed alternatively with their surfaces exposed. The processing electrodes 44 are to be connected to a cathode of a power source 50, and the feeding electrodes 46 are to be connected to an anode of the power source 50. According to this embodiment, the electrode section 48 is so designed that its size is slightly larger than the diameter of the substrate W held by the substrate holder 42.

The pivot arm 40 is connected to the upper end of a pivot shaft 58 that moves up and down via a ball screw 54 by the actuation of a lifting motor 52 and rotates by the actuation of a pivot motor 56. The substrate holder 42 is connected to a substrate-rotating motor 59 that is mounted to the free end of the pivot arm 40, and is allowed to rotate by the actuation of the substrate-rotating motor 59.

The hollow motor 60 is disposed below the electrode section 48. A drive end 64 is formed at the upper end portion of the main shaft 62 and arranged eccentrically position to the center of the main shaft 62. The electrode section 48 is rotatably coupled to the drive end 64 via a bearing (not shown) at the center portion thereof. Three or more rotation-prevention mechanisms are provided in the circumferential direction between the electrode section 48 and the hollow motor 60.

Figure 6A:
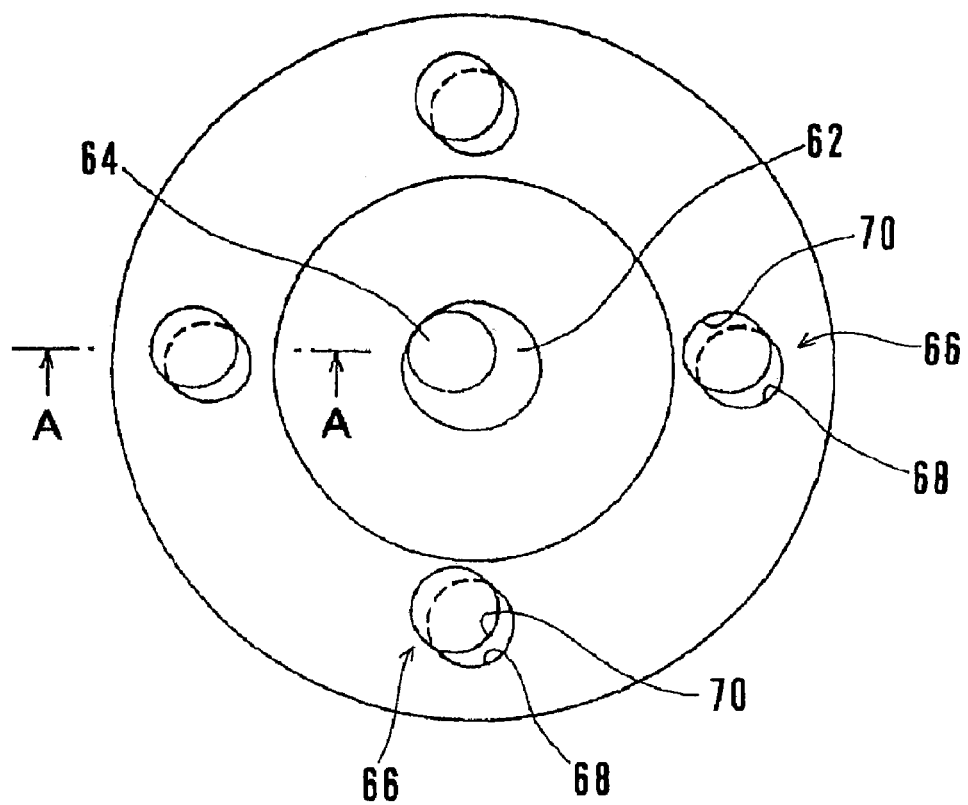
FIG. 6A is a plan view showing the rotation-prevention mechanism of the electrolytic processing apparatus shown in FIG. 4.
Figure 6B:
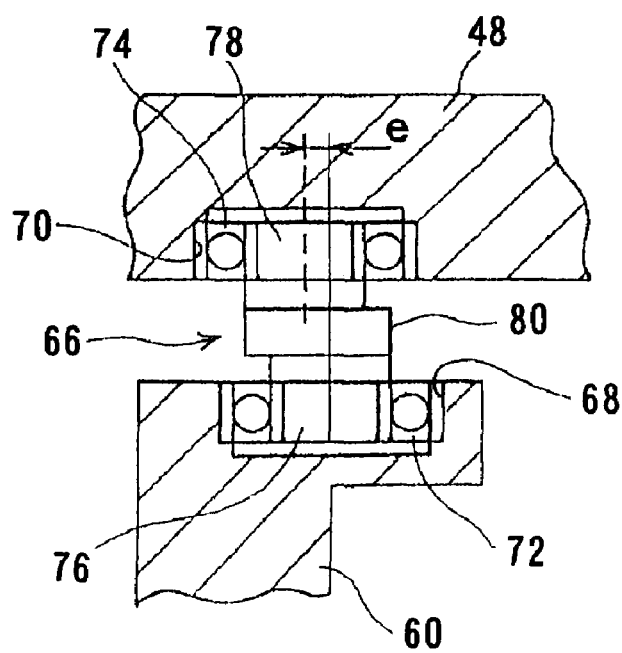
FIG. 6B is a cross-sectional view taken along the line A-A of FIG. 6A.

FIG. 6A is a plan view showing the rotation-prevention mechanisms of this embodiment, and FIG. 6B is a cross-sectional view taken along the line A-A of FIG. 6A. As shown in FIGS. 6A and 6B, three or more (four in FIG. 6A) rotation-prevention mechanisms 66 are provided in the circumferential direction between the electrode section 48 and the hollow motor 60. As shown in FIG. 6B, a plurality of depressions 68, 70 are formed at equal intervals in the circumferential direction at the corresponding positions in the upper surface of the hollow motor 60 and in the lower surface of the electrode section 48. Bearings 72, 74 are fixed in each depression 68, 70, respectively. A connecting member 80, which has two shafts 76, 78 that are eccentric to each other by eccentricity "e", is coupled to each pair of the bearings 72, 74 by inserting the respective ends of the shafts 76, 78 into the bearings 72, 74. The eccentricity of the drive end 64 to the center of the main shaft 62 of the hollow motor 60 is also "e". Accordingly, the electrode section 48 is allowed to make a revolutionary movement with the distance between the center of the main shaft 62 and the drive end 64 as radius "e", without rotation about its own axis, i.e. the so-called scroll movement (translational rotation movement) by the actuation of the hollow motor 60.

Returning to FIG. 4, beside and above the electrode section 48 is disposed a liquid supply nozzle 82 as a liquid supply section for supplying a liquid 22 containing an ion-exchange material 20 (see FIG. 2) between the electrode section 48 and the substrate W held by the substrate holder 42. A liquid recovery tank 84, for recovering the liquid 22 supplied between the electrode section 48 and the substrate W held by the substrate holder 42, is provided around the electrode section 48.

As shown in FIG. 2, the ion-exchange material 20 comprises abase material 16 having anion-exchange group 18 (anion-exchange group or cation-exchange group) in the surface. Though a strongly acidic cation-exchange group (sulfonic acid group) is preferably used as the cation-exchange group, a weakly acidic cation-exchange group (carboxyl group) may also be used. Though a strongly basic anion-exchange group (quaternary ammonium group) is preferably used as the anion-exchange group, a weakly basic anion-exchange group (primary, secondary or tertiary amino group) may also be used.

The ion-exchange material 20 having the ion-exchange group 18 composed of, for example, a strongly basic anion-exchange group can be prepared by the following method: A base material 16 is subjected to the so-called radiation graft polymerization comprising γ-ray irradiation onto the base material 16 and the subsequent graft polymerization, thereby introducing graft chains; and the graft chains thus introduced are then aminated to introduce quaternary ammonium groups thereinto. The capacity of the ion-exchange groups introduced can be determined by the amount of the graft chains introduced. The graft polymerization may be conducted by the use of a monomer such as acrylic acid, styrene, glicidyl methacrylate, sodium styrenesulfonate or chloromethylstyrene, or the like. The amount of the graft chains can be controlled by adjusting the monomer concentration, the reaction temperature and the reaction time. Thus, the degree of grafting, i.e. the ratio of the weight of the base material after graft polymerization to the weight of the base material before graft polymerization, can be made 500% at its maximum. Consequently, the capacity of the ion-exchange groups 18 introduced after graft polymerization can be made 5 meq/g at its maximum.

The ion-exchange material 20 having the ion-exchange group 18 composed of a strongly acidic cation-exchange group can be prepared by the following method: As in the case of the ion-exchange material having a strongly basic anion-exchange group, a base material 16 is subjected to the so-called radiation graft polymerization comprising γ-ray irradiation onto the base material 16 and the subsequent graft polymerization, thereby introducing graft chains; and the graft chains thus introduced are then treated with a heated sulfuric acid to introduce sulfonic acid groups thereinto. If the graft chains are treated with a heated phosphoric acid, phosphate groups can be introduced. The degree of grafting can reach 500% at its maximum, and the capacity of the ion-exchange groups 18 thus introduced after graft polymerization can reach 5 meq/g at its maximum.

The base material 16 of the ion-exchange material 20 may either be an organic material or an inorganic material. Examples of the organic material include a hydrocarbon resin, such as a polystyrene-divinylbenzene copolymer, and a fluororesin. Examples of the inorganic material include an inert metal, such as platinum or gold, a non-conductive oxide, such as $SiO_2$, and a conductive oxide. The ion-exchange material 20 may be of a particulate or gel-like form, and is contained in the liquid 22 generally in an amount of 1 to 90% by weight, preferably 1 to 50% by weight. The liquid 22 containing the ion-exchange material 20 should have a sufficient fluidity so that it can easily enter the space between the substrate W in a lowered position and the electrode section 48, as will be described later. In case the ion-exchange material 20 is of a gel-like form and has a sufficiently low viscosity, it can be used as it is.

When polyethylene or polypropylene is used as the base material 16, graft polymerization can be effected by first irradiating the base material 16 with radiation (γ-rays and electron beam) (pre-irradiation) to generate a radical, and then reacting the radical with a monomer. A uniform grafted chain containing few impurities can be obtained. When another organic polymer is used as the base material 16, on the other hand, graft polymerization can be effected by immersing the base material 16 with a monomer and irradiating the base material 16 with radiation (γ-rays, electron beam, ultraviolet rays) (simultaneous irradiation). Though the grafted chain obtained lacks uniformity, this grafting method is applicable to most types of base materials.

By supplying the liquid 22 containing the ion-exchange material 20 having the ion-exchange group 18 between the substrate W and the electrode section 48, it becomes possible to allow plenty of water to be present around the ion-exchange material 20, thereby increasing the efficiency of the dissociation reaction of water, whereby many water molecules can be dissociated into hydrogen ions and hydroxide ions. The hydroxide ions generated by the water dissociation can be conveyed efficiently to the surfaces of the processing electrodes 44 by the movement of the liquid 22, such as pure water, ultrapure water or an electrolyte solution. A high electric current can therefore be obtained with a low applied voltage. Further, electrolytic processing can be carried out efficiently by supplying a large quantity of liquid 22 between the substrate W and the electrodes (processing electrodes 44 and feeding electrodes 46).

When an ion-exchange material 20 having an ion-exchange group 18, which is either an anion-exchange group or a cation-exchange group, is used singly, materials processible by electrolytic processing are limited and, in addition, impurities are likely to be produced due to the polarities. The liquid 22 may therefore contain an ion-exchange material (anion-exchange material) 20 having an anion-exchange group as the ion-exchange group 18 and an ion-exchange material (cation-exchange material) 20 having a cation-exchange group as the ion-exchange group 18. It is also possible to use an ion-exchange material 20 having both a cation-exchange group and an anion-exchange group as the ion-exchange group 18. This may broaden the range of materials to be processed and suppress the production of impurities.

According to this embodiment, when processing copper, for example, the electrolytic processing action occurs on the cathode side, and therefore the electrodes connected to the cathode of the power source 50 become processing electrodes 44, and the electrodes connected to the anode of the power source 50 become feeding electrodes 46. The processing electrodes 44 and the feeding electrodes 46 are disposed alternately in the circumferential direction. Depending upon the material to be processed, the electrodes connected to the cathode of the power source 50 may serve as feeding electrodes, and the electrodes connected to the anode may serve as processing electrodes. Thus, when the material to be processed is copper, molybdenum or iron, for example, the electrolytic processing action occurs on the cathode side, and therefore electrodes connected to the cathode of the power source 50 becomes processing electrodes 44, and electrodes connected to the anode becomes feeding electrodes 46. On the other hand, when the material to be processed is aluminum or silicon, for example, the electrolytic processing action occurs on the anode side, and therefore the electrodes connected to the anode of the power source 50 become processing electrodes and the electrodes connected to the cathode become feeding electrodes.

Further, in the case where the material to be processed is a conductive oxide such as tin oxide or indium tin oxide (ITO), electrolytic processing is carried out after reducing the material to be processed. More specifically, with reference to FIG. 4, the electrodes connected to the anode of the power source 50 serve as reduction electrodes, and the electrodes connected to the cathode serve as feeding electrodes to effect reduction of the conductive oxide. Subsequently, processing of the reduced conductive material is carried out by making the previous feeding electrodes serve as the processing electrodes. Alternatively, the polarity of the reduction electrodes at the time of reduction of the conductive oxide may be reversed so that the reduction electrodes can serve as the processing electrodes. Removal processing of the conductive oxide may also be effected by making the material to be processed serve as a cathode and allowing it to face an anode electrode.

According to the above-described embodiment, though a copper film 6 as a conductor film formed in the surface of the substrate is processed by electrolytic processing, an unnecessary ruthenium (Ru) film formed on or adhering to a surface of a substrate may be processed (etched and removed) by electrolytic processing in the same manner by making the ruthenium film serve as an anode and the electrodes connected to the cathode serve as processing electrodes.

By thus disposing the processing electrodes 44 and the feeding electrodes 46 alternately in the circumferential direction, fixed feeding portions to supply electricity to a conductive film (portion to be processed) of the substrate are not needed, and processing can be effected to the entire surface of the substrate. The voltage or the current may be applied in a square wave, a pulse form, or a sine curve, besides a continuous form. In the case of the pulse form, the voltage or the current applied has positive and negative potentials, or positive and zero potentials, and a duty cycle is set arbitrarily depending upon a subject to be processed.

With respect to the processing electrodes 44 and the feeding electrodes 46, oxidation or dissolution thereof due to an electrolytic reaction may be a problem. In view of this, as a material for the electrode, it is possible to use, besides the conventional metals and metal compounds, carbon, relatively inactive noble metals, conductive oxides or conductive ceramics. A noble metal-based electrode may, for example, be one obtained by plating or coating platinum or iridium onto a titanium that is used as an electrode base material, and then sintering the coated electrode at a high temperature to stabilize and strengthen the electrode. Ceramic products are generally obtained by heat-treating inorganic raw materials, and ceramic products having various properties are produced from various raw materials including oxides, carbides and nitrides of metals and nonmetals. Among them there are ceramics having an electric conductivity. When an electrode is oxidized, the value of the electric resistance generally increases to cause an increase of applied voltage. However, by protecting the surface of an electrode with a non-oxidative material such as platinum or with a conductive oxide such as an iridium oxide, the decrease of electric conductivity due to oxidation of the base material of an electrode can be prevented.

Pure water, preferably ultra pure water, may be used as the liquid 22 containing the ion-exchange material 20. Pure water herein refers to water having an electric conductivity of not more than 10 μS/cm, and ultrapure water refers to water having an electric conductivity of not more than 0.1 μS/cm.

The use of pure water or ultrapure water containing no electrolyte upon electrolytic processing can prevent extra impurities such as an electrolyte from adhering to and remaining on the surface of the substrate W. Further, copper ions or the like dissolved during electrolytic processing are immediately caught by the ion-exchange groups 18 of the ion-exchange material 20 through the ion-exchange reaction. This can prevent the dissolved copper ions or the like from re-precipitating on the other portions of the substrate W, or from being oxidized to become fine particles which contaminate the surface of the substrate W.

It is possible to use, instead of pure water or ultrapure water, a liquid having an electric conductivity of not more than 500 μS/cm or an electrolytic solution obtained by adding an electrolyte to pure water or ultrapure water. The use of an electrolytic solution can further lower the electric resistance and reduce the power consumption. A solution of a neutral salt such as NaCl or $Na_2SO_4$, a solution of an acid such as HCl or $H_2SO_4$, or a solution of an alkali such as ammonia, may be used as the electrolytic solution, and these solutions may be selectively used according to the properties of the workpiece.

Further, it is also possible to use, instead of pure water or ultrapure water, a liquid obtained by adding a surfactant or the like to pure water or ultrapure water, and having an electric conductivity of not more than 500 μS/cm, preferably not more than 50 μS/cm, more preferably not more than 0.1 μS/cm (resistivity of not less than 10 MΩ·cm). Due to the presence of a surfactant, the liquid can form a layer, which functions to inhibit ion migration evenly, at the surface of the substrate W, thereby moderating concentration of ion exchange (metal dissolution) to enhance the flatness of the processed surface. The surfactant concentration is desirably not more than 100 ppm. When the value of the electric conductivity is too high, the current efficiency is lowered and the processing rate is decreased. The use of the liquid having an electric conductivity of not more than 500 μS/cm, preferably not more than 50 μS/cm, more preferably not more than 0.1 μS/cm, can attain a desired processing rate.

A description will now be given of electrolytic processing of a substrate by the substrate processing apparatus. First, a cassette housing substrates W, for example having in its front surface a copper film 6 as a conductive film (portion to be processed) and a seed layer 7 as shown in FIG. 1B, is set in the loading/unloading section 30, and one substrate W is taken by the transport robot 36 out of the cassette. If necessary, the transport robot 36 transports the substrate W to the reversing machine 32 to reverse the substrate W so that the front surface, i.e. the conductive film (copper film 6) surface, faces downward.

The transport robot 36 receives the reversed substrate W and transports it to the electrolytic processing apparatus 34, and the substrate W is attracted and held by the substrate holder 42. The pivot arm 40 is moved to move the substrate holder 42 holding the substrate W to a processing position right above the electrode section 48. Next, the lifting motor 52 is driven to lower the substrate holder 42 so as to bring the substrate W held by the substrate holder 42 close to the surface of the electrode section 48, i.e. the surfaces of the processing electrodes 44 and the feeding electrodes 46. Thereafter, the substrate-rotating motor 59 is driven to rotate the substrate W and, at the same time, the hollow motor 60 is driven to allow the electrode section 48 to make a scroll movement, thereby moving the substrate W held by the substrate holder 42 and the electrodes (processing electrodes 44 and feeding electrodes 46) relative to each other, while the liquid 22 containing the ion-exchange material 20 is continuously supplied from the liquid supply nozzle 82 to between the substrate W and the electrode section 48 so as to keep the space between the substrate W and the electrode section 48 filled with the liquid 22, and the liquid 22 flowing therebetween is recovered in the liquid recovery tank 84.

A given voltage is applied from the power source 50 to between the processing electrodes 44 and the feeding electrodes 46, and electrolytic processing of the surface conductive film (copper film 6) of the substrate W is carried out at the processing electrodes (cathodes) 44 through the action of hydrogen ions or hydroxide ions produced by the ion-exchange groups 18 of the ion-exchange material 20. Though in this embodiment the substrate W and the electrodes (processing electrodes 44 and feeding electrodes 46) are moved relative to each other during processing by rotating the substrate holder 42 while allowing the electrode section 48 to make a scroll movement, relative movement may be made in other manners. Thus, it is possible to allow at least one of them to make a rotational, eccentrically rotational, translational, reciprocating or scroll movement.

Figure 7:
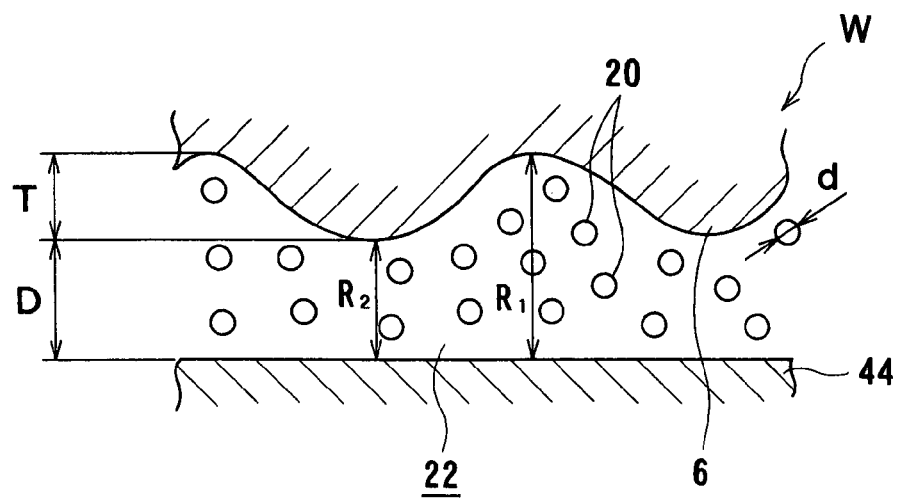
FIG. 7 is a diagram showing the positional relationship between a processing electrode and a workpiece (substrate) in carrying out electrolytic processing by the electrolytic processing apparatus shown in FIG. 4.
Figure 8:
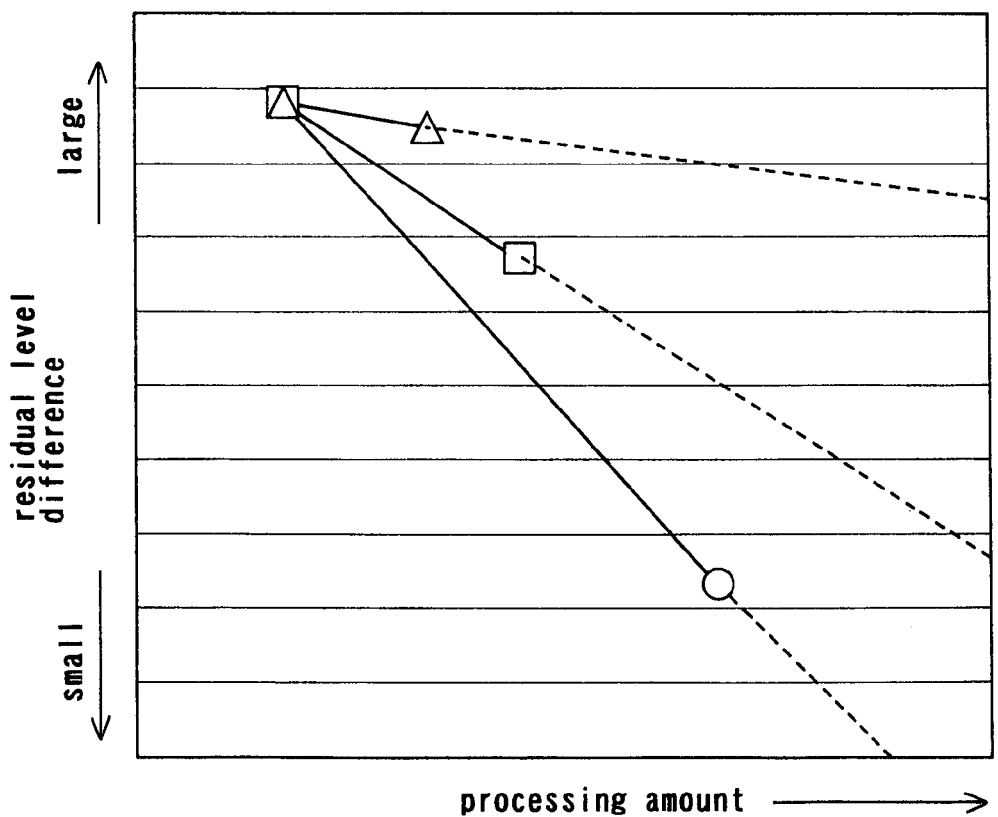
FIG. 8 is a graph showing the relationship between the residual level difference of a surface of a conductive film and the processing amount in electrolytic processing carried out by the electrolytic processing apparatus shown in FIG. 4, with the distance between the workpiece (substrate) and the electrodes being varied.

For elimination of the surface level difference of a conductive film, such as the copper film 6 (see FIG. 1B) on the substrate W, it is preferred to carry out electrolytic processing while keeping the substrate W held by the substrate holder 42 not in contact with, but as close as possible to the processing electrodes 44 such that the distance D between the substrate W and the processing electrodes 44 is not more than 10 μm, preferably on the order of several hundred nm to several μm, as shown in FIG. 7. In this regard, as shown in FIG. 7, there is a surface level difference T of over 100 nm, usually about 200 nm, in the surface of the copper film 6 as a conductive film shown in FIG. 1B, formed on the substrate W such as a semiconductor wafer. When the distance D between the surface of the copper film 6 and the processing electrodes 44 is about 1 mm (>>T=200 nm), for example, the ratio of the distance D to the surface level difference T is extremely large. Since the electric resistance of the liquid 22 is proportional to the distance, it is difficult to preferentially remove a raised portion of the copper film 6. In contrast, when the distance D between the surface of the copper film 6 and the processing electrodes 44 is 1 μm, for example, the ratio of the distance D to the surface level difference T is much smaller. Thus, by making the distance D between the surface of the copper film 6 and the processing electrodes 44 smaller, as shown in FIG. 8, it becomes possible to preferentially process the top of a raised portion of the copper film 6, so that the residual level difference becomes smaller with an increase in the processing amount, whereby the surface of the copper film 6 can be processed to greater flatness.

The use as the liquid 22 of pure water, ultrapure water or a liquid having an electric conductivity of not more than 500 μS/cm, having a large electric resistance, can make the electric resistance $R_1$ between the processing electrodes 44 and the bottom of a recessed portion in the surface of the copper film 6 further larger than the electric resistance $R_2$ between the processing electrodes 44 and the top of a raised portion ($R_1 > R_2$). This can produce a difference in the processing rate between the top of the raised portion and the bottom of the recessed portion, thereby increasing the effect of flattening the surface of the copper film 6.

The ion-exchange material 20 contained in the liquid 22 preferably has such a size (diameter) d that it is smaller than the distance D between the surface of the copper film 6 and the processing electrodes 44 (and the feeding electrodes 46) (d<D), and that it can smoothly pass through the space between the substrate W and the processing electrodes 44. This can prevent the ion-exchange material 20 from not entering the space between the substrate W (copper film 6) and the processing electrodes 44, and can also prevent the ion-exchange material 20 from being squeezed into the space and thereby damaging the surface of the copper film 6. The size (diameter) d of the ion-exchange material 20 is smaller than the distance between the substrate W and the processing electrodes 44 which may be of the order of several hundred nm to several μm, for example, not larger than 1/10 of the distance between the substrate W and the processing electrodes 44.

Figure 9A:
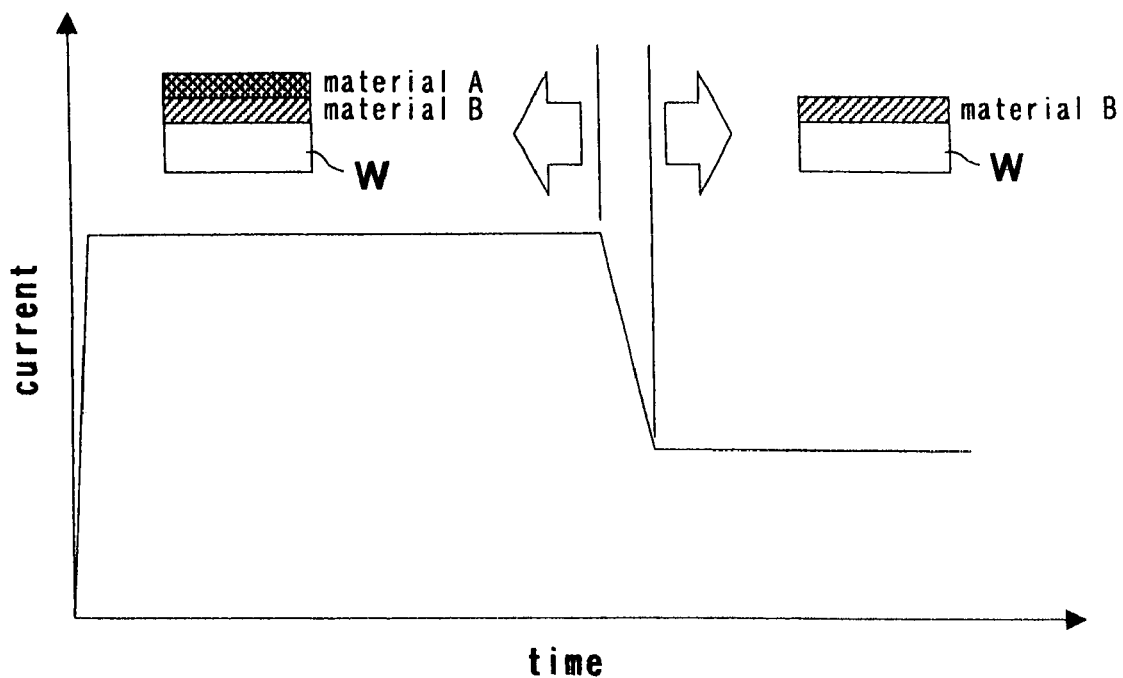
FIG. 9A is a graph showing the relationship between electric current and time in electrolytic processing of the surface of a substrate having different materials formed in the surface.
Figure 9B:
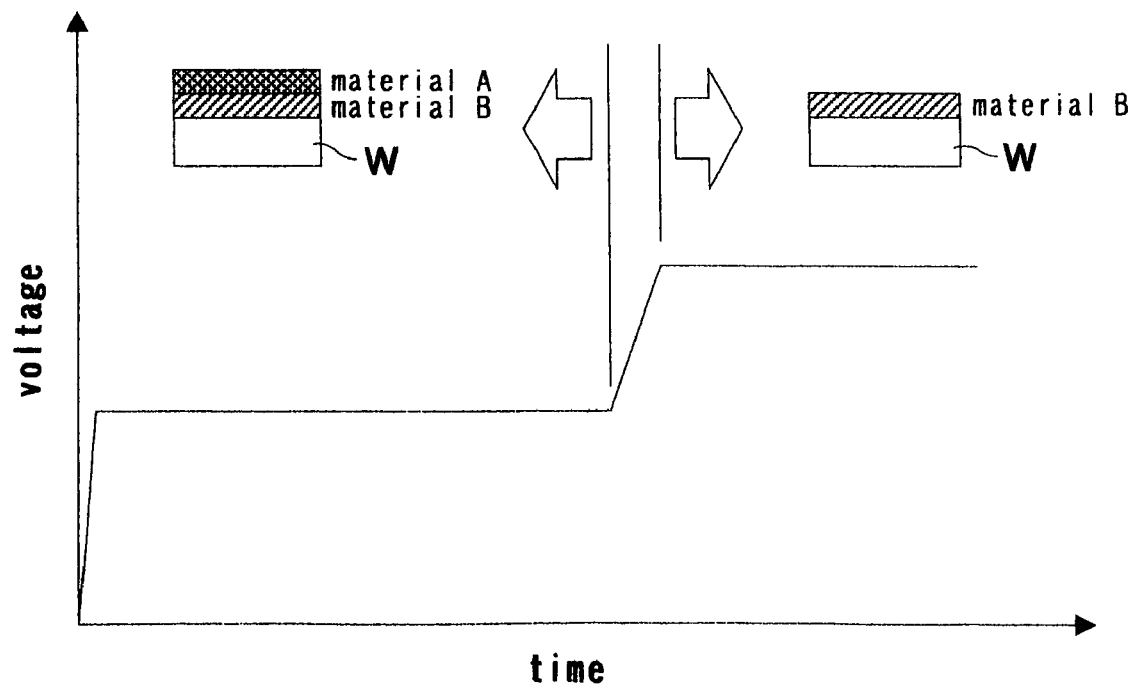
FIG. 9B is a graph showing the relationship between voltage and time in electrolytic processing of the surface of the substrate having the different materials formed in the surface.

During the electrolytic processing, the voltage applied between the processing electrodes 44 and the feeding electrodes 46 or the electric current flowing therebetween is monitored with the control section 38 to detect the end point (termination of processing). It is noted in this connection that in electrolytic processing, the electric current (applied voltage) may vary depending upon the material to be processed even with the same voltage (electric current). For example, as shown in FIG. 9A, when an electric current is monitored in electrolytic processing of the surface of a substrate W on which a film of material B and a film of material A are laminated in this order, a constant electric current is observed during the processing of material A, but it changes upon the shift to the processing of the different material B. Likewise, as shown in FIG. 9B, though a constant voltage is applied between the processing electrodes 44 and the feeding electrodes 46 during the processing of material A, the voltage applied changes upon the shift to the processing of the different material B. FIG. 9A illustrates a case in which the electric current is harder to flow in electrolytic processing of material B compared to electrolytic processing of material A, and FIG. 9B illustrates a case in which the voltage becomes higher in electrolytic processing of material B compared to electrolytic processing of material A. As will be appreciated from the above-described example, the monitoring of a change in electric current or voltage can surely detect the end point.

Though in this embodiment the voltage applied between the processing electrodes 44 and the feeding electrodes 46, or the electric current flowing therebetween is monitored with the control section 38 to detect the end point of processing, it is also possible to monitor with the control section 38a a change in the state of a substrate being processed to detect an arbitrarily set end point of processing. In this case, the end point of processing refers to a point at which a desired processing amount is reached for a specified region in the processing surface of the substrate, or a point at which a parameter correlated with processing amount has reached a value corresponding to a desired processing amount for a specified region in the processing surface. By thus arbitrarily setting and detecting the end point of processing even in the course of processing, it becomes possible to carry out a multi-step electrolytic processing.

After completion of the electrolytic processing, the power source 50 is disconnected form the processing electrodes 44 and the feeding electrodes 46, and the rotations of the substrate holder 42 and the electrode section 48 are stopped. Furthermore, the supply of the liquid 22 is stopped. Thereafter, the substrate holder 42 is raised, and the substrate W is transferred to the transport robot 36 after moving the pivot arm 40. The transport robot 36 takes the substrate W from the substrate holder 42 and, if necessary, transfers the substrate W to the reversing machine 32 for reversing it. The substrate W is transferred to the first cleaning machine 31a for performing a primary cleaning of the substrate, and then transferred to the second cleaning machine 31b for performing a secondary cleaning (finish cleaning) of the substrate. The substrate W is then dried, and the dried substrate W is returned to the cassette of the loading/unloading section 30.

When carrying out electrolytic processing of copper by using an ion-exchange material (cation-exchange material) 20 having a cation-exchange group as an ion-exchange group 18, most of the ion-exchange groups 18 of the ion-exchange material 20 are occupied by copper after processing, which lowers the processing efficiency of the next processing. When carrying out electrolytic processing of copper by using an ion-exchange material (anion-exchange material) 20 having an anion-exchange group as an ion-exchange group 18, on the other hand, fine particles of copper oxide are generated and the particles adhere to the surface of the ion-exchange material 20. Such particles on the ion-exchange material 20 can contaminate the surface of the next substrate to be processed.

According to this embodiment, as shown in FIG. 4, a waste liquid line 90 is connected to the liquid recovery tank 84, and to the waste liquid line 90 is connected to a regeneration section 92 for removing a processing product which has been taken in the ion-exchange material 20 during processing. The liquid 22 regenerated by the regeneration section 92 is stored in a storage tank 94, and the regenerated liquid 22 in the storage bank 94 is fed to the liquid supply nozzle 82 and supplied from the liquid supply nozzle 82 to between the substrate W held by the substrate holder 42 and the electrode section 48 by the actuation of a liquid feed pump 96.

In particular, the regeneration section 92 comprises a regeneration vessel 110 having a pair of regeneration electrodes 100, 102 at the upper and lower ends and a diaphragm 104 located midway between the regeneration electrodes 100, 102, thus defining a regeneration tank 106 on the upper regeneration electrode 100 side and a discharge tank 108 on the lower regeneration electrode 102 side. The waste liquid line 90 is connected to the inlet of the regeneration tank 106, while a liquid feed line 112, communicating with the storage tank 94, is connected to the outlet. On the other hand, a liquid supply line 114 is connected to the inlet of the discharge tank 108, while a liquid discharge line 116 is connected to the outlet.

The liquid 22 after processing, which has flowed into the liquid recovery tank 84, flows into the regeneration tank 106, and is stored therein, in a batch-by-batch manner, by a shut-off valve 118 provided in the waste liquid line 90, while a liquid (electrolyte solution) is continuously supplied from the liquid supply line 114 into the discharge tank 108 to keep the tank 108 filled with the liquid, and the liquid flows in one direction through the discharge tank 108 and is discharged through the liquid discharge line 116.

It is desirable that the diaphragm 104 not hinder the movement therethrough of impurity ions removed from the ion-exchange material 20 contained in the liquid 22 to be regenerated, and inhibit permeation therethrough of the liquid (including ions in the liquid) flowing in the discharge tank 108 into the regeneration tank 106 side and of the liquid in the regeneration tank 106 into the discharge tank 108 side. In this regard, ion exchangers permit selective permeation therethrough of cations or anions. A suitable ion exchanger as a diaphragm can be selected. Further, a membranous ion exchanger can prevent permeation therethrough of a liquid. Thus, a suitably selected membranous ion exchanger can meet the above requirements for the diaphragm 104.

It is desirable that the liquid to be supplied into the discharge tank 108 be a liquid, such as an electrolyte solution, which has a high electric conductivity and does not form a hardly soluble or insoluble compound through a reaction with ions removed from the ion-exchange material 20 to be regenerated. In this regard, the liquid is to discharge those ions, which have moved from the ion-exchange material 20 to be regenerated and passed through the diaphragm 104, out of the system by the flow of the liquid. The above liquid having a high electric conductivity, because of its low electric resistance, can reduce the power consumption in the regeneration section 92. Furthermore, the above liquid, which does not form an insoluble compound (by-product) through a reaction with the impurity ions, can therefore prevent adhesion of such a solid matter to the diaphragm 104. A suitable liquid may be chosen depending upon the kind of impurity ion to be discharged. For example, when regenerating an ion-exchange material 20 that was used in electrolytic polishing of copper, sulfuric acid with a concentration of 1% by weight or higher may be used.

The one regeneration electrode 100 is to be electrically connected to one of the electrodes (e.g. cathode) of a regeneration power source 120, while the other regeneration electrode 102 is to be electrically connected to the other electrode (e.g. anode) of the regeneration power source 120.

According to this embodiment, an ion exchanger having the same type of ion-exchange group as that of the ion-exchange material 20 is used as the diaphragm 104. That is, when a cation-exchange material having a cation-exchange group is used as the ion-exchange material 20, a cation exchanger is used as the diaphragm (ion exchanger) 104. When an anion-exchange material having an anion-exchange group is used as the ion-exchange material 20, an anion-exchanger is used as the diaphragm (ion exchanger) 104.

When a cation-exchange material is used as the ion-exchange material 20, the regeneration electrode 100 on the regeneration tank 106 side is made an anode while the regeneration electrode 102 on the discharge tank 108 side is made a cathode, as shown in FIG. 4. Adversely, when an anion-exchange material is used as the ion-exchange material 20, the regeneration electrode 100 on the regeneration tank 106 side is made a cathode while the regeneration electrode 102 on the discharge tank 108 side is made an anode.

In the regeneration section 92, the liquid 22 which was used in electrolytic processing and recovered in the liquid recovery tank 84 is stored in batch-by-batch manner in the regeneration tank 106. While the liquid 22 is stored in the regeneration tank 106, the regeneration electrode 100 on the regeneration tank 106 side is connected to one of the electrodes (e.g. cathode) of the regeneration power source 120 and the regeneration electrode 102 on the discharge tank 108 side is connected to the other electrode (e.g. anode) so as to apply a voltage between the regeneration electrodes 100, 102, and a liquid is introduced into the discharge tank 108 and the liquid is allowed to flow in one direction in the discharge tank 108 and flow out of it.

Upon the electrical connection, as described above, the regeneration electrode 100 on the regeneration tank 106 side is made to have the reverse polarity of the polarity of the ion-exchange material 20 (and of the diaphragm 104). Thus, when a cation-exchange material having a cation-exchange group is used as the ion-exchange material 20 (and as the diaphragm 104), the regeneration electrode 100 on the regeneration tank 106 side is made an anode and the regeneration electrode 102 on the discharge tank 108 side is made a cathode, as shown in FIG. 4. Adversely, when an anion-exchange material having an anion-exchange group is used as the ion-exchange material 20 (and as the diaphragm 104), the regeneration electrode 100 on the regeneration tank 106 side is made a cathode and the regeneration electrode 102 on the discharge tank 108 side is made an anode.

The processing product (ions) taken in the ion-exchange groups 18 of the ion-exchange material 20 contained in the liquid 22 stored in the regeneration tank 106 are moved toward the discharge tank 108, passed through the diaphragm 104, and introduced into the discharge tank 108. The ions that have moved into the discharge tank 108 are discharged out of the system by the flow of the liquid supplied into the discharge tank 108. Regeneration of the ion-exchange material 20 is thus effected. When a cation-exchange material having a cation-exchange group is used as the ion-exchange material 20, cations taken in the cation-exchange groups of the ion-exchange material 20 pass through the diaphragm 104 and move into the discharge tank 108; and when an anion-exchange material having an anion-exchange group is used as the ion-exchange material 20, anions taken in the anion-exchange groups of the ion-exchange material 20 pass through the diaphragm 104 and move into the discharge tank 108, whereby the ion-exchange material 20 is regenerated.

As described above, an ion exchanger having the same type of ion-exchange group as the ion-exchange material 20 to be regenerated is used as the diaphragm 104. This can prevent movement of the impurity ions in the ion-exchange material 20 through the diaphragm (ion exchanger) 104 from being hindered by the diaphragm (ion exchanger) 104, thereby preventing an increase in the power consumption. Further, this inhibits permeation through the diaphragm 104 of the liquid (including ions in the liquid) on the regeneration tank 106 side and of the liquid on the discharge tank 108 side, thereby preventing re-contamination of the regenerated ion-exchange material 20. Furthermore, a liquid having an electric conductivity of not less than 50 μS/cm, which does not form a hardly soluble or insoluble compound through a reaction with ions removed from the ion-exchange material 20, is supplied into the discharge tank 108. Such a liquid, because of its low electric resistance, can reduce the power consumption in the regeneration section 92. Moreover, the liquid does not form an insoluble compound (by-product) through a reaction with the impurity ion. In this regard, an insoluble compound, if formed, will adhere to the diaphragm 104 whereby the electric resistance between the regeneration electrodes 100, 102 will be changed, making it difficult to control the electrolytic current. Such a problem can thus be prevented.

By thus regenerating the ion-exchange material 20 by the regeneration section 92 and supplying the liquid 22 containing the regenerated ion-exchange material 20 to between the substrate W held by the substrate holder 42 and the electrode section 48, it becomes possible to supply the liquid 22, which always contains a fresh ion-exchange material 20, between the substrate W and the electrodes (processing electrodes 44 and feeding electrodes 46), and to eliminate an operation of a change of ion exchanger (ion-exchange material) as is necessary, for example, to an electrolytic processing apparatus that employs a fixed ion exchanger. Though the regeneration of the ion-exchange material carried out in a batch-by-batch manner has been described above, it is also possible to carry out the regeneration in a continuous manner.

Figure 10:
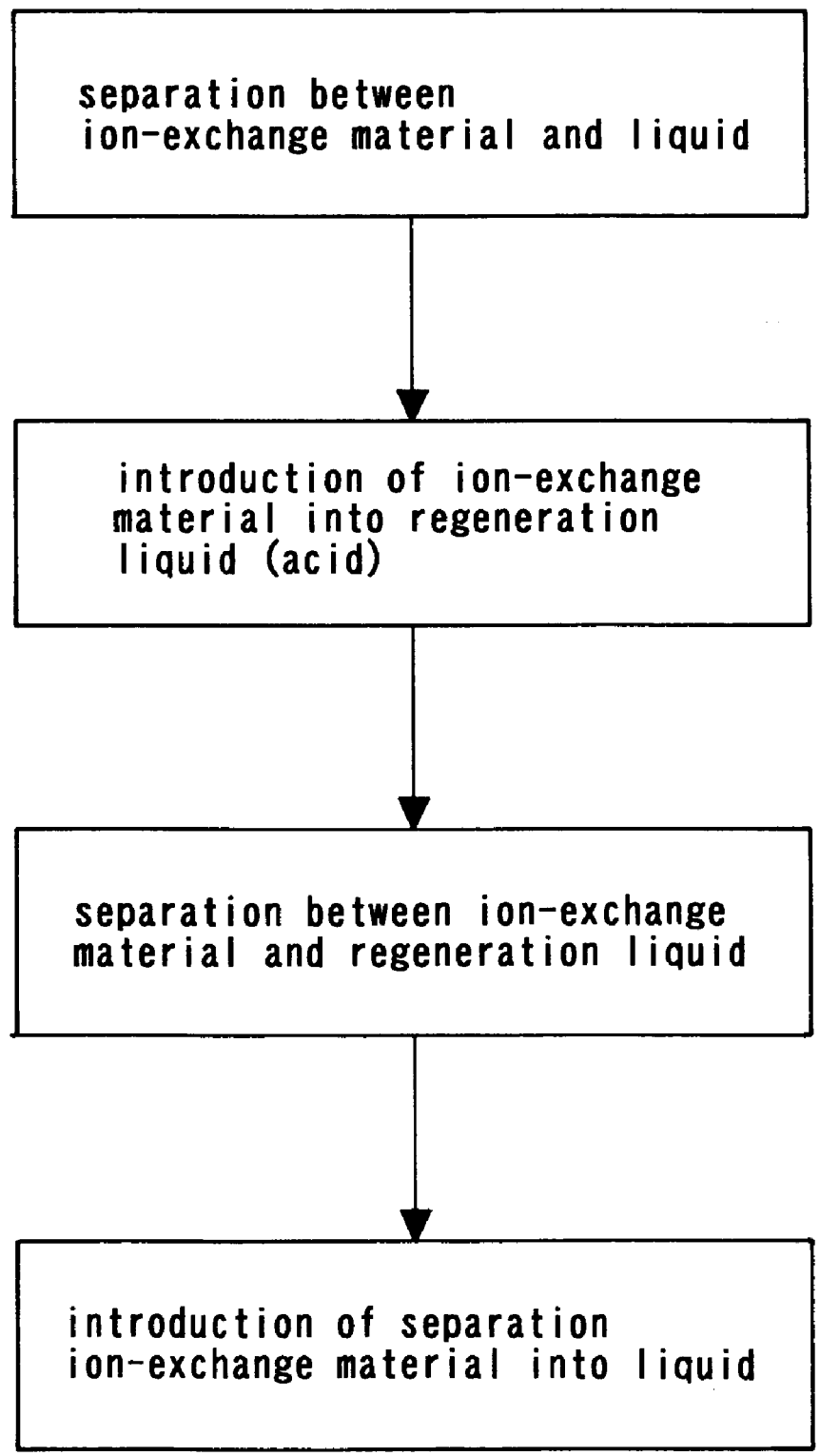
FIG. 10 is a flow chart of a process for the regeneration of an ion-exchange material.

FIG. 10 shows a flow chart of another process for the regeneration of ion-exchange material. According to this process, an ion-exchange material which has taken in a processing product during processing is first separated from a liquid, and the separated ion-exchange material is introduced into a regeneration liquid to remove the processing product, taken in the ion-exchange material, from the ion-exchange material. The ion-exchange material after the removal of the processing product is separated from the regeneration liquid and added again to the above liquid (solution) for reuse. An acid solution is employed as the regeneration liquid in the case of using a cation-exchange group as the ion-exchange group of the ion-exchange material, while an alkali solution is employed in the case of using an anion-exchange group.

According to the present invention, electrolytic processing of a workpiece is carried out while supplying a liquid containing an ion-exchange material between the workpiece and a processing electrode and/or a feeding electrode. This allows plenty of water to be present around the ion-exchange material, thereby increasing the efficiency of the dissociation reaction of water. Further, the supply of the liquid does not rely on the water permeability of the ion-exchange material itself. This can easily increase the flow rate of the liquid supplied between the workpiece and the processing electrode and/or the feeding electrode, enabling electrolytic processing to be carried out efficiently. Furthermore, the provision of a mechanism for removing a processing product, which has been taken in the ion-exchange material during processing, from the ion-exchange material, makes it possible to supply a liquid, which always contains a fresh ion-exchange material, between the workpiece and the processing electrode and/or the feeding electrode, and to eliminate an operation for a change of ion exchanger (ion-exchange material). The present invention ensures a good surface flattening effect even when carrying out processing of a conductive film formed on a substrate, such as a semiconductor wafer.

Figure 11:
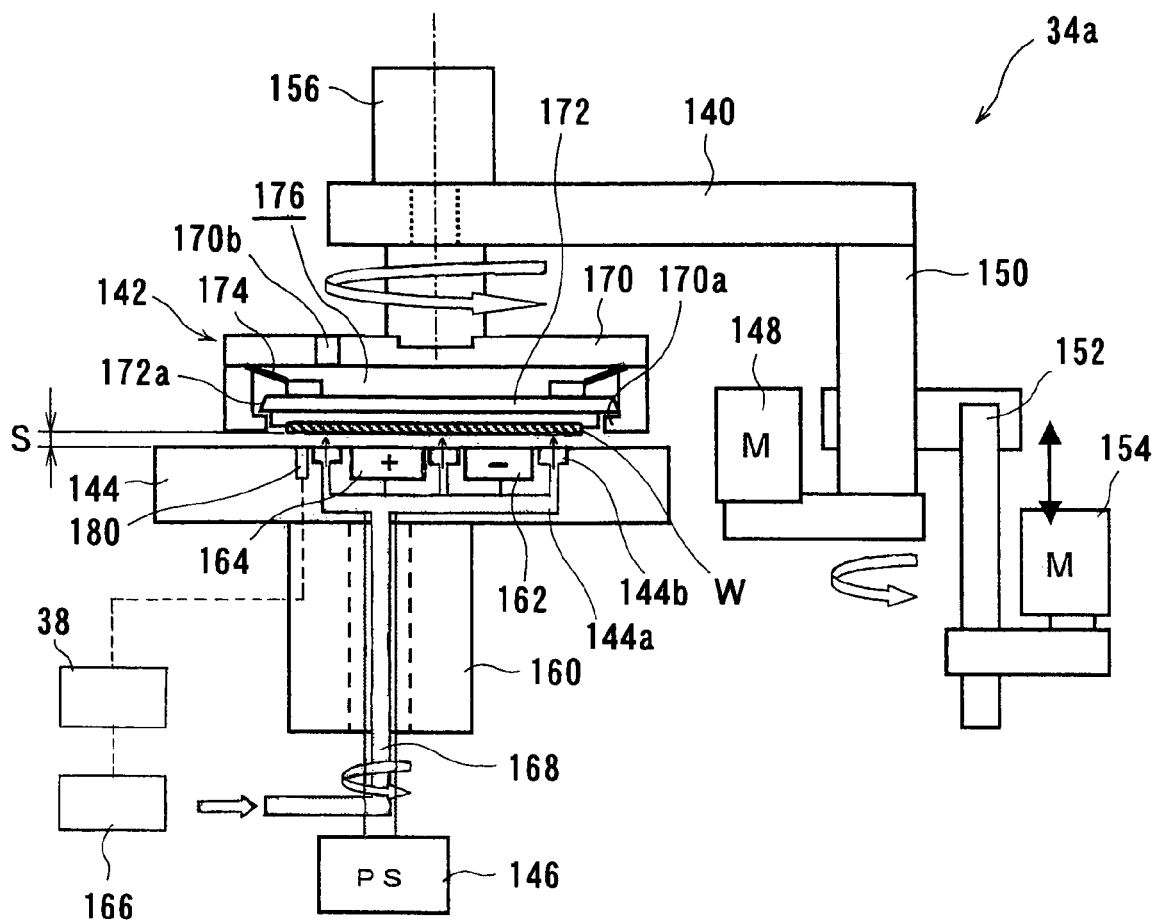
FIG. 11 is a vertical sectional front view schematically showing an electrolytic processing apparatus according to another embodiment of the present invention.

FIG. 11 is a vertical sectional view schematically showing an electrolytic processing apparatus 34a according to another embodiment of the present invention. As shown in FIG. 11, the electrolytic processing apparatus 34a includes an arm 140 that can move vertically and pivot horizontally, a substrate holder 142, supported at the free end of the arm 140, for detachably holding the substrate W with its front surface facing downward (face-down), a disk-shaped electrode section 144, which is positioned beneath the substrate holder 142 and made of an insulating material, and a power source 146 to be connected to the processing electrodes 162 and the feeding electrodes 164 of the electrode section 144.

The arm 140 is mounted to the upper end of a pivot shaft 150 that rotates by the actuation of a pivot motor 148, and pivots horizontally by the actuation of the pivot motor 148. The pivot shaft 150 is engaged with a ball screw 152 that extends vertically, and moves vertically together with the arm 140 by the actuation of a lifting motor 154 that is connected to the ball screw 152.

The substrate holder 142 is connected to a substrate-rotating motor 156 as a first drive section, which is allowed to move the substrate W held by a substrate holder 142 and the electrode section 144 relatively to each other. The substrate holder 142 is rotated (about its axis) by the actuation of the substrate-rotation motor 156. The arm 140 can move vertically and pivot horizontally, as described above, the substrate holder 142 can move vertically and pivot horizontally together with the arm 140. A hollow motor 160 as a second drive section, which is allowed to move the substrate W and the electrode section 144 relatively to each other, is disposed below the electrode section 144. The electrode section 144 is connected to the hollow motor 160. Therefore, the electrode section 144 makes a revolutionary movement without rotation about its own axis, the so-called scroll movement (translational rotation movement) by the actuation of the hollow motor 160. It is of course possible to allow the electrode section 144 to make a rotation movement about the rotation center displaced from the rotation center of the substrate holder 142 by the actuation of the hollow motor 160.

A plurality of processing electrodes 162 and feeding electrodes 164 each e.g. in a fan-like shape are embedded alternately, with their surfaces (upper surfaces) exposed, in the electrode section 144. According to this embodiment, the surfaces (upper surfaces) of the electrode section 144, the processing electrodes 162 and the feeding electrodes 164 are on the same level. When processing copper, for example, the processing electrodes 162 are connected to the cathode of the power source 146, and the feeding electrodes 164 are connected to the anode of the power source 146.

Liquid supply holes 144b, communicating with a liquid flow passage 144a formed in the electrode section 144, are provided at positions surrounding each processing electrode 162 and each feeding electrode 164 of the electrode section 144. The liquid flow passage 144a is connected to a liquid supply pipe 168 that extends from a liquid supply source 166 having a liquid pressurizing section, such as a pump, and penetrates through the hollow portion of the hollow motor 160. The liquid supply source 166, the liquid supply pipe 168, the liquid flow passage 144a and the liquid supply holes 144b constitute a liquid supply section which allows a liquid, preferably pure water, more preferably ultrapure water, supplied at a predetermined pressure from the liquid supply source 166 to pass through the liquid supply pipe 168 and the liquid flow passage 144a, and jets the liquid upwardly from the liquid supply holes 144b, thereby supplying the liquid between the electrode section 144 and the substrate W held by the substrate holder 142 positioned above the electrode section 144. Though in this embodiment the liquid is supplied from the liquid supply holes 144b provided between the processing electrodes 162 and the feeding electrodes 164, it is also possible to supply the liquid from supply holes provided in the processing electrodes and/or the feeding electrodes themselves, or from the outside of the electrode section.

The substrate holder 142 includes a downwardly-open cylindrical housing 170 and a disc-shaped chucking plate 172 for detachably holding the substrate W, for example, by attraction. The chucking plate 172 is housed in the housing 170 such that when it holds the substrate W on the lower surface, the lower surface of the substrate W is positioned below the lower surface of the housing 170. An inwardly-projecting claw portion 170a is provided at the lower end of the housing 170, while a larger-diameter flange portion 172a is provided in the upper portion of the chucking plate 172, so that the chucking plate 172 can be prevented from escaping from the housing 170 by engaging the flange portion 172a with the claw portion 170a.

A truncated conical elastic body 174, such as a rubber, is hermetically fixed at its one end to the inner circumferential surface of the housing 170 and is hermetically fixed at the other end to a peripheral portion of the upper surface of the chucking plate 172, thus defining an air chamber 176 between the housing 170, the chucking plate 172 and the elastic body 174. The housing 170, in the ceiling, is provided with an air introduction hole 170b for introducing air into the air chamber 176. The chucking plate 172 is pressed downwardly by the pressure of the air introduced into the air chamber 176 while a floating force acts upwardly on the substrate W held by the chucking plate 172. When the floating force becomes larger than the pressing force pressing the chucking plate 172 downwardly, the flange portion 172a of the chucking plate 172 detaches from the claw portion 170a of the housing 170 into a floating state. The floating position of the chucking plate 172 changes vertically with a change in the degree of the floating force acting upwardly on the substrate W.

In the interior of the electrode section 144 is provided a detector 180 for detecting the distance S between the surface (lower surface) of the substrate W held by the substrate holder 142 and the surfaces (upper surfaces) of the processing electrodes 162 and the feeding electrodes 164 embedded in the electrode section 144. For example, an optical (reflection) distance sensor that detects the distance to the substrate W by receiving a laser beam reflected from the surface of the substrate W, or an eddy current-type distance sensor that generates an eddy current in the surface (conductive film) of the substrate W to detect the distance to the substrate W may be used.

In case the electrolytic processing apparatus is provided with an end point sensor for detecting the end point of electrolytic processing, the end point sensor may be employed also as the detector 180. Thus, in this case, the thickness of a conductive film, etc. and the distance between the lower surface of the substrate W held by the substrate holder 142 and the upper surfaces of the processing electrodes 162 and the feeding electrodes 164 can be measured simultaneously with the single sensor (end point sensor).

The output of the detector 180 is inputted to a control section 38, and the output of the control section 38 is inputted to the liquid supply source 166 for feed-back control of the liquid pressurizing section, such as a pump. According to this embodiment, the distance S between the substrate W held by the substrate holder 142 and the upper surfaces of the processing electrodes 162 and feeding electrodes 164 is controlled at a predetermined value which is not more than 100 μm and at which they are not in contact with each other by adjusting, during electrolytic processing, the pressure of the liquid supplied from the liquid supply source 166 to between the electrode section 144 and the substrate W held by the substrate holder 142. The distance S is preferably not more than 50 μm, more preferably not more than 10 μm, and most preferably not more than 1 μm.

In particular, while carrying out electrolytic processing by supplying a liquid at a predetermined pressure between the electrode section 144 and the substrate W held by the chucking plate 172 of the substrate holder 142, the distance S between the lower surface of the substrate W and the upper surfaces of the processing electrodes 162 and the feeding electrodes 164 is detected with the detector 180. When the distance S is smaller than a predetermined value of, for example, not more than 1 μm, the pressure of the liquid supplied from the liquid supply source 166 is increased to thereby raise the floating position of the chucking plate 172. When the distance S is larger than the predetermined value, on the other hand, the pressure of the liquid supplied from the liquid supply source 166 is decreased to thereby lower the floating position of the chucking plate 172. In this manner, the distance S between the lower surface of the substrate W and the upper surfaces of the processing electrodes 162 and the feeding electrodes 164 is controlled so that it is kept at a predetermined value of, for example, not more than 1 μm during electrolytic processing.

A description will now be given of electrolytic processing of a substrate as carried out by using the substrate processing apparatus 34a of this embodiment as the substrate processing apparatus 34 shown in FIG. 3.

First, a cassette housing substrates W, for example having in its front surface a copper film 6 as a conductive film (portion to be processed) and a seed layer 7 as shown in FIG. 1B, is set in the loading/unloading section 30, and one substrate W is taken by the transport robot 36 out of the cassette. If necessary, the transport robot 36 transports the substrate W to the reversing machine 32 to reverse the substrate W so that the front surface, i.e. the conductive film (copper film 6) surface, faces downward.

The transport robot 36 receives the reversed substrate W and transports it to the electrolytic processing apparatus 34a, and the substrate W is held by the chucking plate 172 of the substrate holder 142. At the same time, air at a predetermined pressure is introduced into the air chamber 176 of the substrate holder 142 and the air chamber 176 is sealed off, thereby pressing the chucking plate 172 downwardly at a predetermined pressure. The arm 140 is then moved to move the substrate holder 142 holding the substrate W to a processing position right above the electrode section 144. Next, the lifting motor 154 is driven to lower the substrate holder 142 so as to bring the substrate W held by the chucking plate 172 close to or into contact with the surfaces of the processing electrodes 162 and the feeding electrodes 164.

Next, while supplying a liquid at a predetermined pressure from the liquid supply source 166 to between the electrode section 144 and the substrate W, and floating the chucking plate 172 by the pressure of the liquid jetted from the liquid supply holes 144b toward the substrate W and acting on the substrate W, the distance S between the substrate W and the surfaces of the processing electrodes 162 and the feeding electrodes 164 is detected with the detector 180, and the pressure of the liquid supplied from the liquid supply source 166 is adjusted so that the distance S becomes a predetermined value of, for example, not more than 1 μm.

In this state, according to necessity, the substrate-rotating motor 156 is driven to rotate the substrate W and, at the same time, the hollow motor 160 is driven to allow the electrode section 144 to make a scroll movement, thereby moving the substrate W held by the substrate holder 142 and the electrodes (processing electrodes 162 and feeding electrodes 164) relative to each other, while a given voltage is applied from the power source 146 to between the processing electrodes 162 and the feeding electrodes 164. Electrolytic processing of the surface conductive film (copper film 6) of the substrate W is effected at the processing electrodes (cathodes) 162 through the action of hydroxide ions or hydrogen ions produced by the dissociation of water molecules in the liquid. During the electrolytic processing, the distance S between the lower surface of the substrate W and the upper surfaces of the processing electrodes 162 and the feeding electrodes 164 is detected with the detector 180, and the pressure of the liquid supplied from the liquid supply source 166 is adjusted so as to keep the distance S at a predetermined value of, for example, not more than 1 μm.

Figure 12:
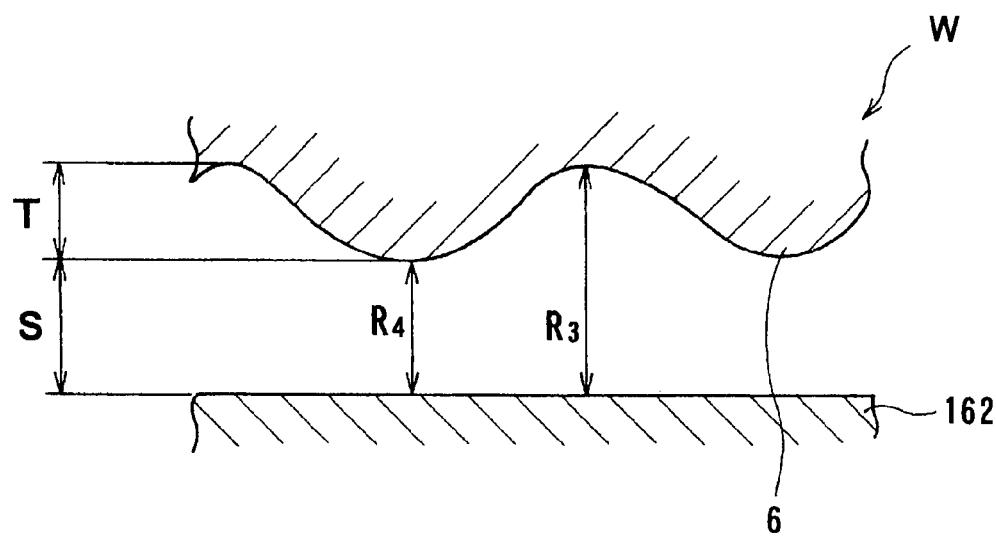
FIG. 12 is a diagram showing the positional relationship between a workpiece (substrate) and a processing electrode in carrying out electrolytic processing by the electrolytic processing apparatus shown in FIG. 11.

For elimination of the surface level difference of a conductive film, such as the copper film 6 (see FIG. 1B) on the substrate W, it is preferred to carry out electrolytic processing while keeping the substrate W held by the substrate holder 142 not in contact with, but as close as possible to the processing electrodes 162 such that the distance S between the substrate W and the processing electrodes 162 is not more than 10 μm, preferably on the order of several hundred nm to several μm, as shown in FIG. 12. In this regard, as shown in FIG. 12, there is a surface level difference T of over 100 nm, usually about 200 nm, in the surface of the copper film 6 as a conductive film shown in FIG. 1B, formed on the substrate W such as a semiconductor wafer. When the distance S between the surface of the copper film 6 and the processing electrodes 162 is about 1 mm, for example, the ratio of the distance S to the surface level difference T is extremely large, that is, the distance $R_3$ between the processing electrodes 162 and the bottom of a recessed portion in the surface of the copper film 6 is substantially equal to the distance $R_4$ between the processing electrodes 162 and the top of a raised portion of the copper film 6. Since the electric resistance of the liquid is proportional to the distance, it is difficult to preferentially remove a raised portion of the copper film 6. In contrast, when the distance S between the surface of the copper film 6 and the processing electrodes 162 is 1 μm, for example, the ratio of the distance S to the surface level difference T is much smaller. It thus becomes possible to preferentially process the top of a raised portion of the copper film 6, so that the residual level difference becomes smaller with an increase in the processing amount, whereby the surface of the copper film 6 can be processed to greater flatness.

Figure 13:
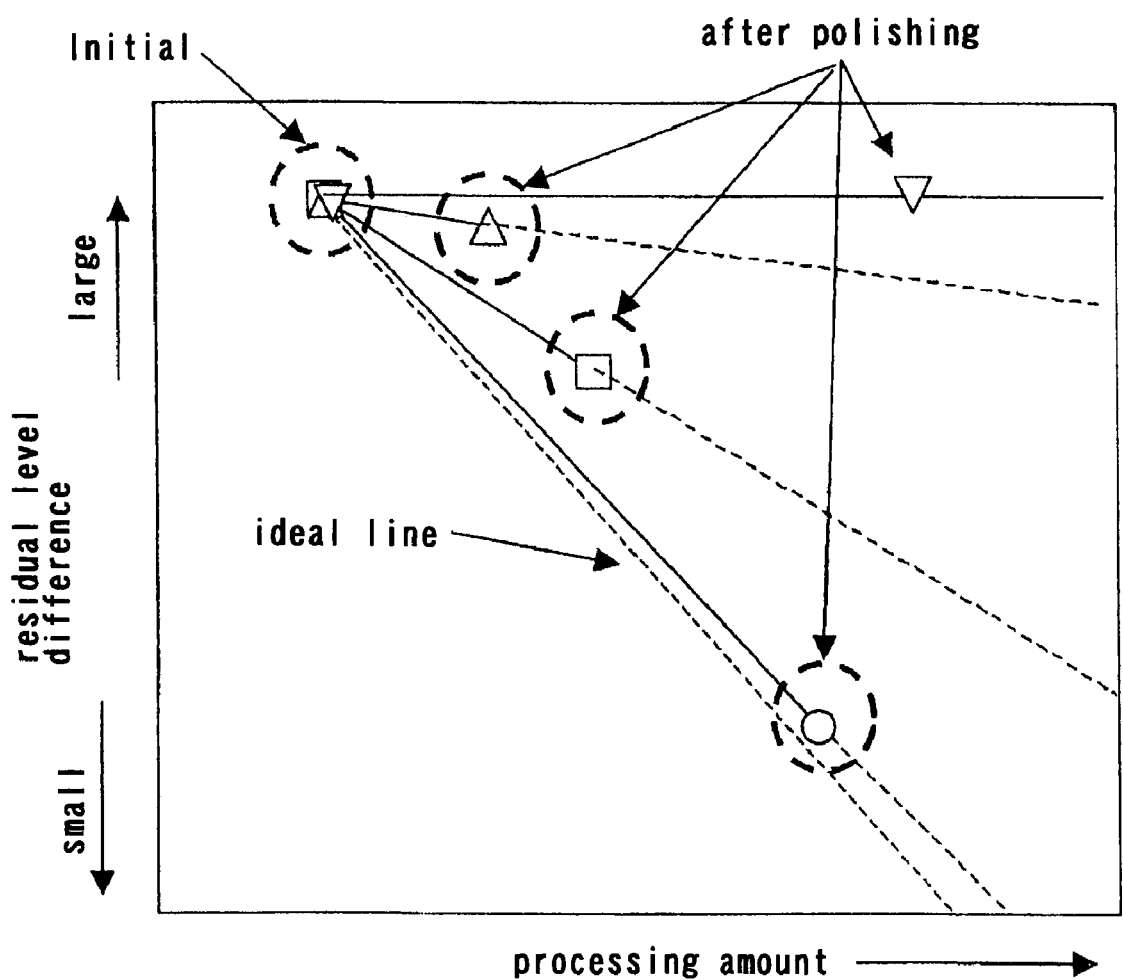
FIG. 13 is a graph showing the relationship between the residual level difference of a surface of a conductive film and the processing amount in electrolytic processing carried out by the electrolytic processing apparatus shown in FIG. 11, with the distance between the workpiece (substrate) and the electrodes being varied.

FIG. 13 shows the relationship between residual level difference and processing amount in electrolytic processing (polishing) carried out by using ultrapure water as a processing liquid and varying the distance S between a workpiece (substrate) and an electrode (processing electrode) as follows: 50 μm, 10 μm, 1 μm and 1 mm. As can be seen from FIG. 13, the initial surface level difference can be little eliminated when the distance S between the workpiece (substrate) and the electrode (processing electrode) is 1 mm, whereas the employment of the distance S of 50 μm produces an appreciable effect of eliminating the initial surface level difference, and the employment of the distance S of 1 μm can provide an almost ideal line.

Generally, the initial surface level difference of a copper film formed on a substrate, such as a semiconductor wafer, for the formation of copper interconnects is, in most cases, of the order of 200 nm. In view of this and also of the above consideration as well as the experimental results, it is desirable that the distance S between the surface of the copper film 6 and the processing electrodes 162 be generally not more than 100 μm, preferably not more than 50 μm, more preferably not more than 10 μm, and most preferably not more than 1 μm.

As with the above-described embodiment, the voltage applied between the processing electrodes 162 and the feeding electrodes 164, or the electric current flowing therebetween is monitored with the control section 38 during electrolytic processing to detect the end point of processing.

During electrolytic processing, heat is generated by the electric resistance of the surface to be processed, or by collision between water molecules and ions moving in the liquid (pure water) between the processing surface and the surface to be processed. In electrolytic processing e.g. a copper film deposited on the surface of a substrate under a controlled constant voltage, when a barrier layer or an insulating film becomes exposed with the progress of electrolytic processing, the electric resistance increases and the current value decreases, and the heat value decreases in order. Accordingly, the processing amount may be determined by detecting the change in the heat value. The end point of processing may therefore be detected. Alternatively, the film thickness of a to-be-processed film on a substrate may be determined by detecting a change in the intensity of reflected light due to a difference in reflectance produced when a different material is reached in the substrate.

The film thickness of a to-be-processed film on a substrate may also be determined by generating an eddy current within a to-be-processed conductive film, for example, a copper film, and monitoring the eddy current flowing within the substrate to detect a change in e.g. the frequency, thereby detecting the end point of processing. Further, in electrolytic processing, the processing rate depends on the value of the electric current flowing between the processing electrodes and the feeding electrodes, and the processing amount is proportional to the quantity of electricity, determined by the product of the current value and the processing time. Accordingly, the processing amount may be determined by integrating the quantity of electricity, and detecting the integrated value reaching a predetermined value. The end point of processing may thus be detected.

After completion of the electrolytic processing, the power source 146 is disconnected from the processing electrodes 162 and the feeding electrodes 164, and the rotations of the substrate holder 142 and the electrode section 144 are stopped. Furthermore, the supply of the liquid to between the electrode section 144 and the substrate W is stopped. Thereafter, the substrate holder 142 is raised, and the substrate W is transferred to the transport robot 36 after moving the arm 140. The transport robot 36 takes the substrate W from the substrate holder 142 and, if necessary, transfers the substrate W to the reversing machine 32 for reversing it. The substrate W is transferred to the first cleaning machine 31a for performing a primary cleaning of the substrate, and then transferred to the second cleaning machine 31b for performing a secondary cleaning (finish cleaning) of the substrate. The substrate W is then dried, and the dried substrate W is returned to the cassette of the loading/unloading section 30.

If the liquid supplied between the substrate W and the electrode section 144 during electrolytic processing has too high an electric conductivity, the resistance itself of the liquid is small, though the resistance ratio, corresponding to distance ratio, is the same. Accordingly, since the resistance difference due to the distance difference is small, it is difficult with such a liquid to process the surface of a conductive film having surface irregularities to remove the irregularities. It is thus preferred to use pure water or ultrapure water as the liquid. The use of pure water or ultrapure water, not containing an electrolyte, in electrolytic processing can prevent unnecessary impurities, such as an electrolyte, from adhering to and remaining on the surface of the substrate W. Furthermore, the use of pure water or ultrapure water having a low electric conductivity makes the resistance difference due to the distance difference larger, making it possible to process the surface of a conductive film having surface irregularities to remove the irregularities.

As with the above-described embodiment, instead of pure water or ultrapure water, it is also possible to use a liquid having an electric conductivity of not more than 500 μS/cm or a liquid prepared by adding a surfactant or the like to pure water or ultrapure water, having an electric conductivity of not more than 500 μS/cm, preferably not more than 50 μS/cm, and more preferably not more than 0.1 μS/cm (resistivity of not less than 10 MΩ·cm).

Figure 14:
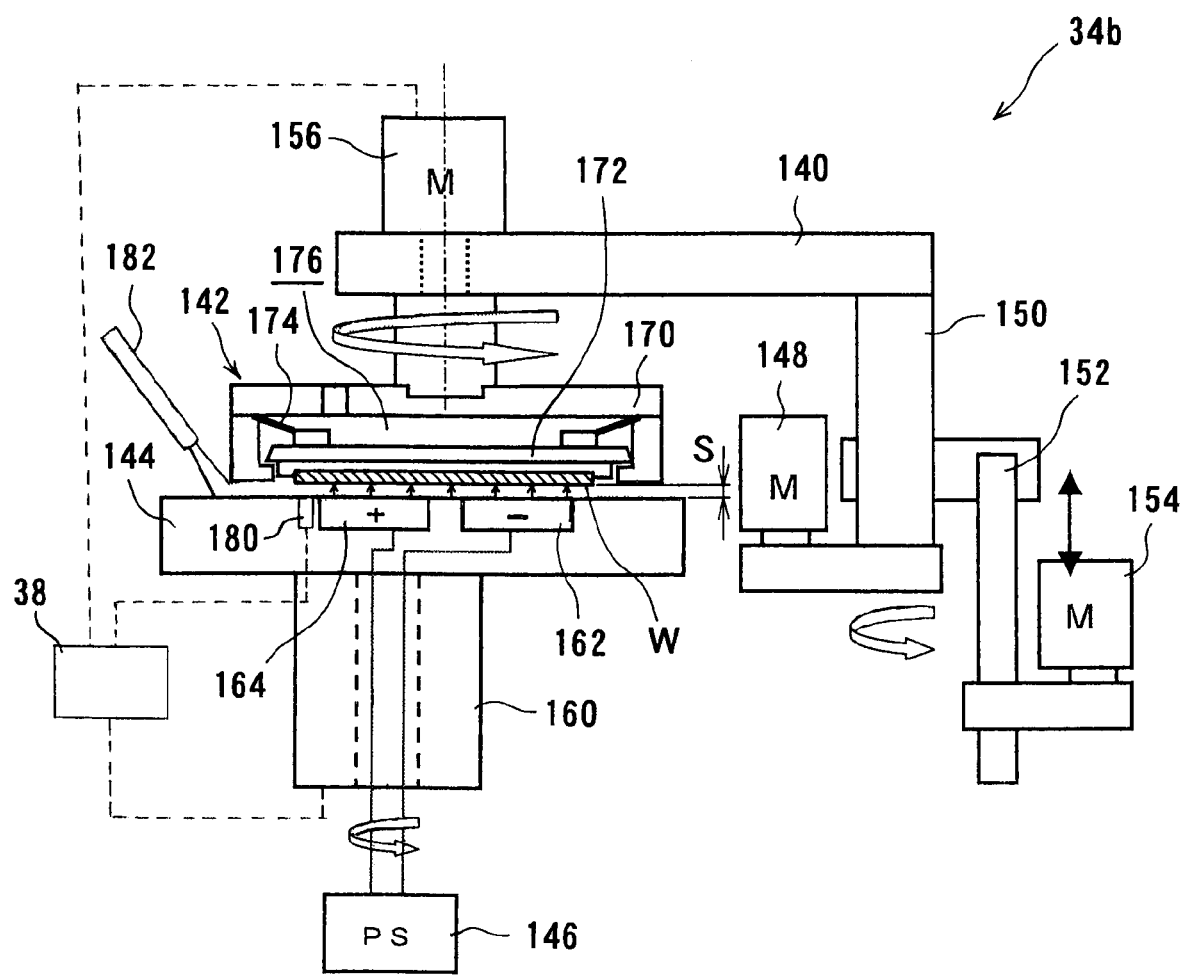
FIG. 14 is a vertical sectional front view schematically showing an electrolytic processing apparatus according to yet another embodiment of the present invention.

FIG. 14 shows an electrolytic processing apparatus 34b according to another embodiment of the present invention. The electrolytic processing apparatus 34b shown in FIG. 14 differs from the electrolytic processing apparatus 34a shown in FIG. 11 in the following respects: The electrolytic processing apparatus 34b shown in FIG. 14 employs a liquid supply section including a liquid supply nozzle 182, disposed above the electrode section 144, for supplying a liquid from the side of the substrate holder 142 to between the electrode section 144 and the substrate W held by the substrate holder 142. A signal, inputted from the detector 180 to the control section 38, is fed back to the substrate-rotating motor 156 and the hollow motor 160 to control the rotational speeds of the substrate-rotating motor 156 and the hollow motor 160, thereby adjusting the relative speed between the substrate W held by the substrate holder 142 and the electrodes (processing electrodes 162 and feeding electrodes 164) embedded in the electrode section 144. It is also possible to control the rotational speed of only one of the substrate-rotating motor 156 and the hollow motor 160.

According to this embodiment, the degree of the force applied by the liquid to the substrate W upon electrolytic processing is adjusted through a liquid force (dynamic pressure) that occurs in the liquid present between the electrode section 144 and the substrate W held by the substrate holder 142 by a relative movement between them. That is, the degree of the force applied to the substrate W is adjusted by changing the relative speed between the electrode section 144 and the substrate W held by the substrate holder 142.

In particular, while carrying out electrolytic processing by supplying a liquid at a predetermined pressure from the liquid supply nozzle (liquid supply section) 182 to between the electrode section 144 and the substrate W held by the chucking plate 172 of the substrate holder 142 and making relative movement therebetween, the distance S between the lower surface of the substrate W and the upper surfaces of the processing electrodes 162 and the feeding electrodes 164 is detected with the detector 180. When the distance S is smaller than a predetermined value of, for example, not more than 1 μm, the relative speed between the electrode section 144 and the substrate W is increased to thereby raise the floating position of the chucking plate 172. When the distance S is larger than the predetermined value, on the other hand, the relative speed between the electrode section 144 and the substrate W is decreased to thereby lower the floating position of the chucking plate 172. In this manner, the distance S between the lower surface of the substrate W and the upper surfaces of the processing electrodes 162 and the feeding electrodes 164 is controlled so that it is kept at a predetermined value of, for example, not more than 1 μm during electrolytic processing.

According to this embodiment, the substrate W held by the chucking plate 172 is brought close to or into contact with the surfaces of the processing electrodes 162 and the feeding electrodes 164 in the same manner as in the preceding embodiment, and the supply of the liquid from the liquid supply nozzle (liquid supply section) 182 to between the electrode section 144 and the substrate W is started. While moving the electrode section 144 and the substrate W relative to each other by rotating the substrate-rotating motor 156 and the hollow motor 160, and floating the chucking plate 172 by the liquid pressure (dynamic pressure) acting on the substrate W, the distance S between the substrate W and the electrodes (processing electrodes 162 and feeding electrodes 164) is detected with the detector 180, and the rotational speeds of the substrate-rotating motor 156 and the hollow motor 160 are adjusted so that the distance S becomes a predetermined value of, for example, not more than 1 μm.

In this state, a given voltage is applied from the power source 146 to between the processing electrodes 162 and the feeding electrodes 164. Electrolytic processing of the surface conductive film (copper film 6) of the substrate W is effected at the processing electrodes (cathodes) 162 through the action of hydroxide ions or hydrogen ions produced by the dissociation of water molecules in the liquid. During the electrolytic processing, the distance S between the lower surface of the substrate W and the upper surfaces of the processing electrodes 162 and the feeding electrodes 164 is detected with the detector 180, and the rotational speeds of the substrate-rotating motor 156 and the hollow motor 160 are adjusted so as to keep the distance S at a predetermined value of, for example, not more than 1 μm.

The relative speed between the substrate W and the electrodes (processing electrodes 162 and feeding electrodes 164) is generally not less than 0.1 m/s, preferably not less than 1 m/s, and more preferably not less than 2 m/s.

FIG. 15 shows an electrolytic processing apparatus 34c according to yet another embodiment of the present invention. The electrolytic processing apparatus 34c shown in FIG. 15 differs from the electrolytic processing apparatus 34a shown in FIG. 11 in that a membranous ion exchanger 184 integrally covering the surfaces of the processing electrodes 162 and the feeding electrodes 164 is mounted on the surface of the electrode section 144, and the distance S between the surface (upper surface) of the ion exchanger 184 and the surface (lower surface) of the substrate W is detected with the detector 180 during electrolytic processing to control the distance S between the ion exchanger 184 and the substrate W. The ion exchanger 184 has through-holes at positions corresponding to the liquid supply holes 144b so that the flow of the liquid jetted from each liquid supply hole 144b hits directly against the substrate W.

The processing rate can be considerably enhanced by thus interposing the ion exchanger 184 between the substrate W and the electrodes (processing electrodes 162 and feeding electrodes 164). In this regard, electrochemical processing using ultrapure water is effected by a chemical interaction between hydroxide ions in ultrapure water and a material to be processed. However, the amount of the reactant hydroxide ions in ultrapure water is as small as $10^{-7}$ mol/L under normal temperature and pressure conditions, so that the removal processing efficiency can decrease due to reactions (such as an oxide film-forming reaction) other than the reaction for removal processing. It is therefore necessary to increase hydroxide ions in order to carry out removal processing efficiently. A method for increasing hydroxide ions includes a method which promotes the dissociation reaction of ultrapure water by a catalytic material, and an ion exchanger can be effectively used as such a catalytic material. More specifically, the activation energy relating to water-molecule dissociation reaction is lowered by the interaction between functional groups in an ion exchanger and water molecules, whereby the dissociation of water is promoted to thereby enhance the processing rate.

It is preferable to use an ion exchanger having good water permeability as the ion exchanger 184. By allowing pure water or ultrapure water or the like to flow within the ion exchanger 184, a sufficient amount of water can be supplied to a functional group (sulfonic acid group in the case of an ion exchanger carrying a strongly acidic cation-exchange group) thereby to increase the amount of dissociated water molecules, and the process product (including a gas) formed by the reaction with hydroxide ions (or OH radicals) can be removed by the flow of water, whereby the processing efficiency can be enhanced.

Such the ion exchanger 184 may be composed of, for example, non-woven fabric which has an anion-exchange group or a cation-exchange group. A cation exchanger preferably carries a strongly acidic cation-exchange group (sulfonic acid group); however, a cation exchanger carrying a weakly acidic cation-exchange group (carboxyl group) may also be used. Though an anion exchanger preferably carries a strongly basic anion-exchange group (quaternary ammonium group), an anion exchanger carrying a weakly basic anion-exchange group (tertiary or lower amino group) may also be used.

The non-woven fabric carrying a strongly basic anion-exchange group can be prepared by the following method: A polyolefin non-woven fabric having a fiber diameter of 20-50 μm and a porosity of about 90% is subjected to the so-called radiation graft polymerization, as described above, comprising γ-ray irradiation onto the non-woven fabric and the subsequent graft polymerization, thereby introducing graft chains; and the graft chains thus introduced are then aminated to introduce quaternary ammonium groups thereinto. The non-woven fabric carrying a strongly acidic cation-exchange group can be prepared by the following method: A polyolefin non-woven fabric having a fiber diameter of 20 to 50 μm and a porosity of about 90% is subjected to the so-called radiation-induced graft polymerization, as described above, comprising γ-ray irradiation onto the non-woven fabric and the subsequent graft polymerization, thereby introducing graft chains; and the graft chains thus introduced are then treated with a heated sulfuric acid to introduce the sulfonic acid group thereinto.

The base material of the ion exchanger 184 may be a polyolefin such as polyethylene or polypropylene, or any other organic polymer such as polyurethane. Further, besides the form of a non-woven fabric, the ion exchanger may be in the form of a woven fabric, a sheet, a porous material, or short fibers, etc. When polyethylene or polypropylene is used as the base material, graft polymerization can be effected by first irradiating radioactive rays (γ-rays or electron beam) onto the base material (pre-irradiation) to thereby generate a radical, and then reacting the radical with a monomer, whereby uniform graft chains with few impurities can be obtained. When an organic polymer other than polyolefin is used as the base material, on the other hand, radical polymerization can be effected by impregnating the base material with a monomer and irradiating radioactive rays (γ-rays, electron beam, ultraviolet-rays) onto the base material (simultaneous irradiation). Though this method fails to provide uniform graft chains, it is applicable to a wide variety of base materials.

By using a non-woven fabric having an anion-exchange group or a cation-exchange group as the ion exchanger 184, it becomes possible that a liquid, such as pure water or ultrapure water, can freely move within the non-woven fabric and easily arrive at the active points in the non-woven fabric having a catalytic activity for water dissociation, so that many water molecules are dissociated into hydrogen ions and hydroxide ions. Further, by the movement of a liquid, such as pure water or ultrapure water, the hydroxide ions produced by the water dissociation can be efficiently carried, whereby a high electric current can be obtained even with a low voltage applied.

When the ion exchanger 184 has only one of anion-exchange groups and cation-exchange groups, a limitation is imposed on electrolytically processible materials and, in addition, impurities are likely to form due to the polarity. In order to solve this problem, an anion exchanger carrying an anion-exchange group and a cation exchanger carrying a cation-exchange group may be superimposed, or the ion exchanger may carry both of an anion-exchange group and a cation-exchange group per se, whereby a range of materials to be processed can be broadened and the formation of impurities can be restrained.

According to this embodiment, the distance S between the upper surface of the ion exchanger 184 and the substrate W held by the substrate holder 142 is controlled at a predetermined value which is not more than 100 μm and at which they are not in contact with each other by adjusting, during electrolytic processing, the pressure of the liquid supplied from the liquid supply source 166 to between the electrode section 144 and the substrate W held by the substrate holder 142. The distance S is preferably not more than 50 μm, more preferably not more than 10 μm, and most preferably not more than 1 μm.

According to this method, even when a conductive film formed on the substrate, such as a semiconductor wafer, has surface irregularities of the level difference of e.g. about 200 nm, it becomes possible to produce a difference in electric resistance and thus a difference in processing rate between a raised portion and a recessed portion of the irregularities so that the surface irregularities can be processed into a flat processed surface. Further, since electrolytic processing is carried out without sliding between the ion exchanger 184 and the surface of the substrate W, defects in the surface of the substrate W and wear of the ion exchanger 184 can be prevented.

Figure 16:
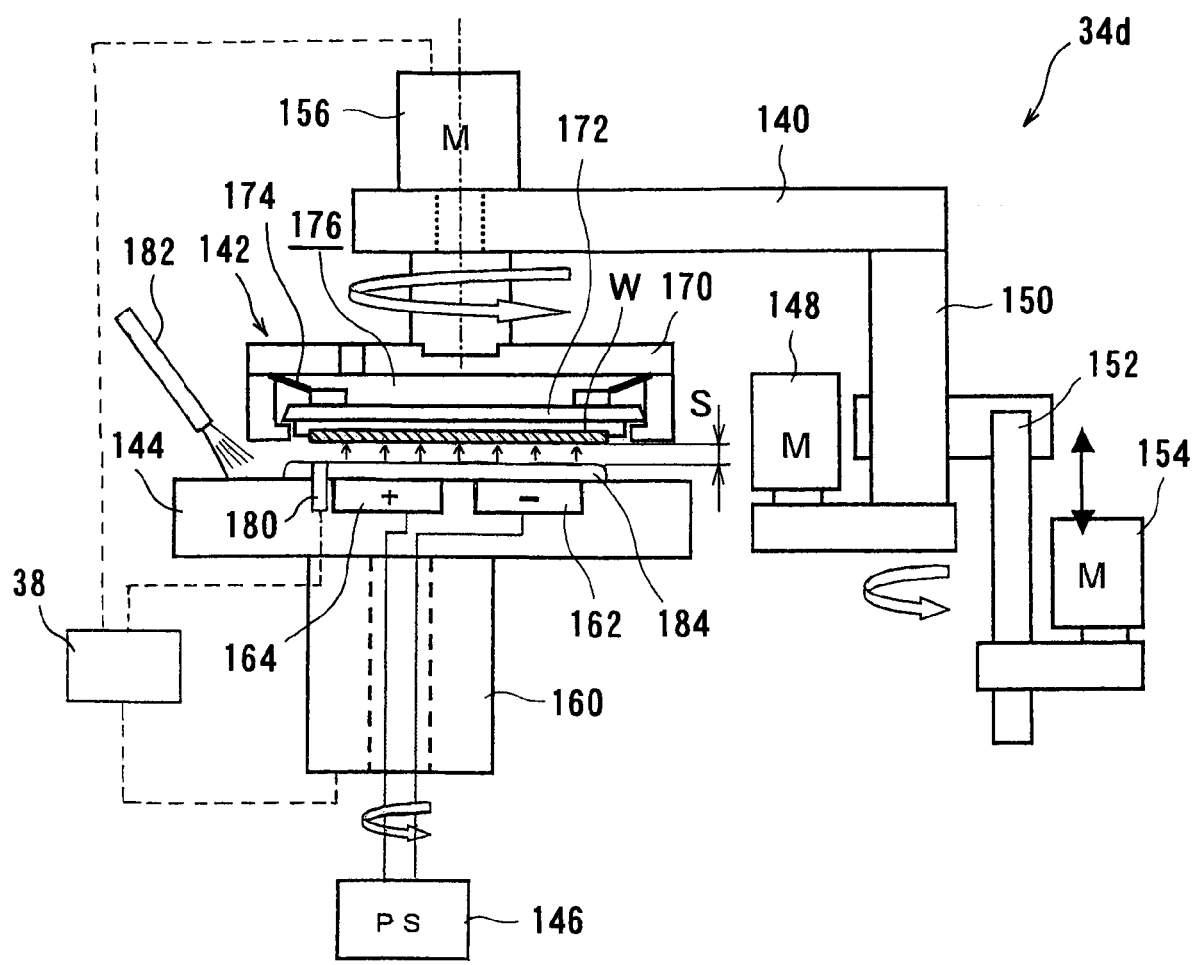
FIG. 16 is a vertical sectional front view schematically showing an electrolytic processing apparatus according to yet another embodiment of the present invention.

FIG. 16 shows an electrolytic processing apparatus 34*d* according to yet another embodiment of the present invention. The electrolytic processing apparatus 34*d* shown in FIG. 16 differs from the electrolytic processing apparatus 34*b* shown in FIG. 14 in that a membranous ion exchanger 184 integrally covering the surfaces of the processing electrodes 162 and the feeding electrodes 164 is mounted on the surface of the electrode section 144, and the distance S between the surface (upper surface) of the ion exchanger 184 and the surface (lower surface) of the substrate W is detected with the detector 180 during electrolytic processing to control the distance S between the ion exchanger 184 and the substrate W.

Thus, according to this embodiment, the distance S between the upper surface of the ion exchanger 184 and the substrate W held by the substrate holder 142 is controlled at a predetermined value which is not more than 100 μm and at which they are not in contact with each other by adjusting, during electrolytic processing, the rotational speed of at least one of the substrate-rotating motor 156 and the hollow motor 160 to thereby adjust the relative speed between the substrate W held by the substrate holder 142 and the electrodes (processing electrodes 162 and feeding electrodes 164) embedded in the electrode section 144. The distance S is preferably not more than 50 μm, more preferably not more than 10 μm, and most preferably not more than 1 μm.

When electrolytic processing is carried out using the ion exchanger 184 disposed between the substrate W and the electrodes (processing electrodes 162 and feeding electrodes 164), as in the embodiments shown in FIGS. 15 and 16, an attraction force acts between the substrate W and the ion exchanger 184, and the attraction force is influenced by the voltage applied between the processing electrodes 162 and the feeding electrodes 164. Accordingly, instead of adjusting the pressure of the liquid supplied from the liquid supply source 166 to between the electrode section 144 and the substrate W held by the substrate holder 142 or adjusting the relative speed between the substrate W held by the substrate holder 142 and the electrodes (processing electrodes 162 and feeding electrodes 164) embedded in the electrode section 144, or in combination with such adjustment, it is also possible to control the voltage applied between the processing electrodes 162 and the feeding electrodes 164 so as to control the distance S between the upper surface of the ion exchanger 184 and the substrate S held by the substrate holder 142 at a predetermined value which is not more than 100 μm and at which they are not in contact with each other. The distance S is preferably not more than 50 μm, more preferably not more than 10 μm, and most preferably not more than 1 μm.

Though the distance S between the substrate W and the electrodes (processing electrodes 162 and feeding electrodes 164) in the embodiments shown in FIGS. 11 and 14, and the distance S between the substrate W and the ion exchanger 184 integrally covering the surfaces of the processing electrodes 162 and the feeding electrodes 164 in the embodiments shown in FIGS. 15 and 16 are respectively detected with the detector 180, it is also possible to prepare a calibration curve, thereby eliminating the use of a detector. In this case, the distance between the substrate and the electrodes (processing electrodes and feeding electrodes), or the distance between the substrate and the ion exchanger can be determined by subtracting the weight of the substrate and the weight of the substrate holder and, according to necessity, also the attraction force acting between the substrate and the ion exchanger, from the liquid pressure acting on the substrate or from the dynamic pressure generated in the liquid by the relative movement between the substrate and the electrodes (processing electrodes and feeding electrodes).

Figure 17:
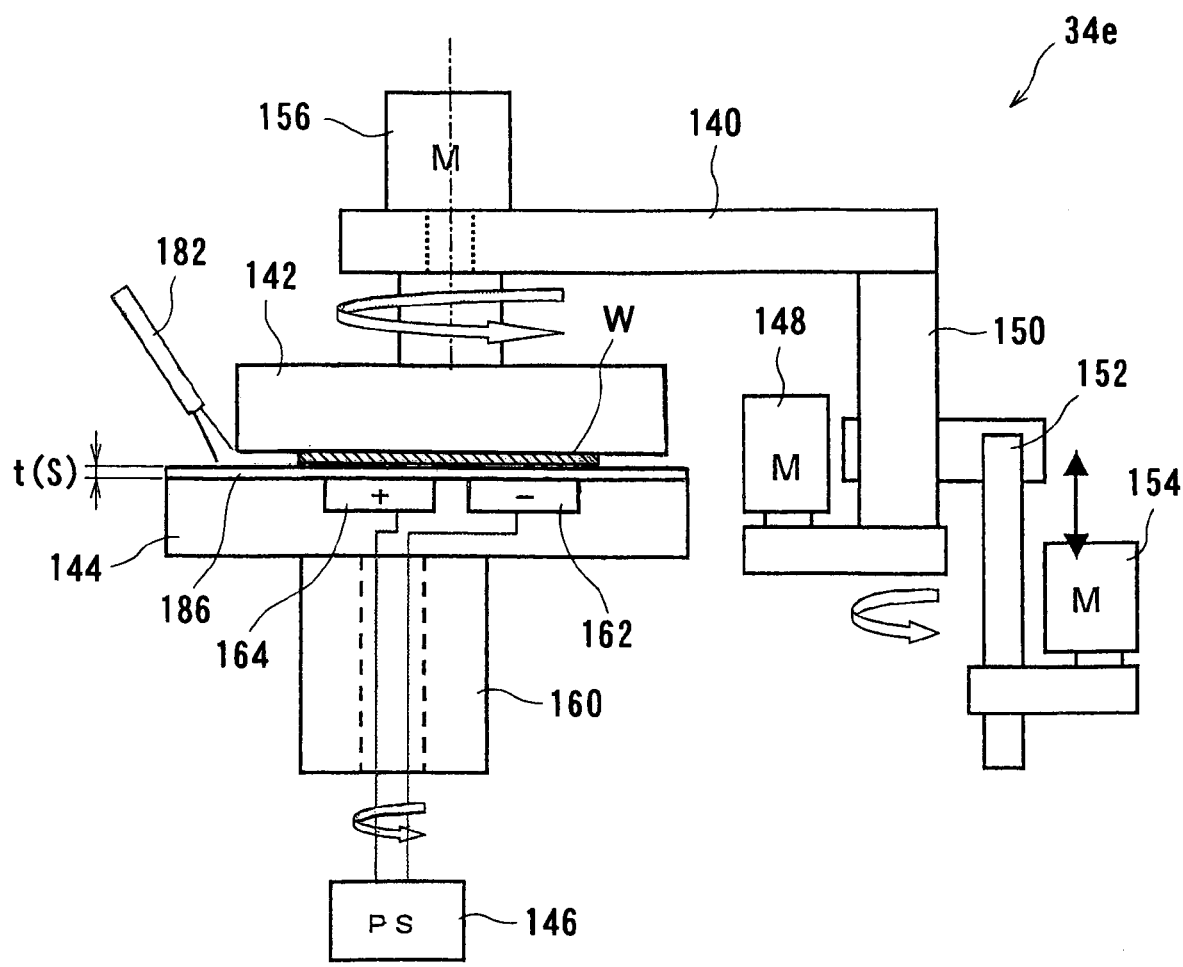
FIG. 17 is a vertical sectional front view schematically showing an electrolytic processing apparatus according to yet another embodiment of the present invention.

FIG. 17 shows an electrolytic processing apparatus 34e according to yet another embodiment of the present invention. The electrolytic processing apparatus 34e shown in FIG. 17 differs from the electrolytic processing apparatus 34d shown in FIG. 14 in that the substrate holder 142 of the apparatus 34e does not employ the chucking plate or the like and attracts and holds a substrate W directly on its lower surface, and that an insulating spacer 186 having a thickness t of not more than 100 µm, integrally covering the processing electrodes 162 and the feeding electrodes 164, is mounted on the surface of the electrode section 144, so that control of the rotational speeds of the substrate-rotating motor 156 and the hollow motor 160 is not performed. The thickness t of the insulating spacer 186 is preferably not more than 50 µm, more preferably not more than 10 µm, and most preferably not more than 1 µm.

According to this embodiment, while keeping the surface (lower surface) of the substrate W held by the substrate holder 142 in contact with the surface (upper surface) of the insulating spacer 186 and continuously supplying a liquid to between the electrode section 144 and the substrate W, the substrate W and the electrodes (processing electrodes 162 and feeding electrodes 164) are moved relative to each other by the actuations of the substrate-rotating motor 156 and the hollow motor 160, and a voltage is applied between the processing electrodes 162 and the feeding electrodes 164 to carry out electrolytic processing. During the electric processing, the distance S between the substrate W and the electrodes (processing electrodes 162 and feeding electrodes 164) keeps equal to the thickness t of the insulating spacer 186 (t=S), i.e., not more than 100 µm, preferably not more than 50 µm, more preferably not more than 10 µm, and most preferably not more than 1 µm, without control of the rotational speeds of the substrate-rotating motor 156 and the hollow motor 160.

By thus keeping the distance S between the substrate W and the electrodes (processing electrodes 162 and feeding electrodes 164) at a particular value of not more than 100 µm, preferably not more than 50 µm, more preferably not more than 10 µm, most preferably not more than 1 µm, it becomes possible to process the surface of a conductive film having surface irregularities, for example, formed on a substrate such as a semiconductor wafer, flatly while removing the irregularities.

The insulating spacer 186 is preferably formed of a porous material. This ensures water permeability of the insulating spacer 186, so that a liquid, such as ultrapure water or pure water, can pass through the insulating spacer 186.

Figure 18:
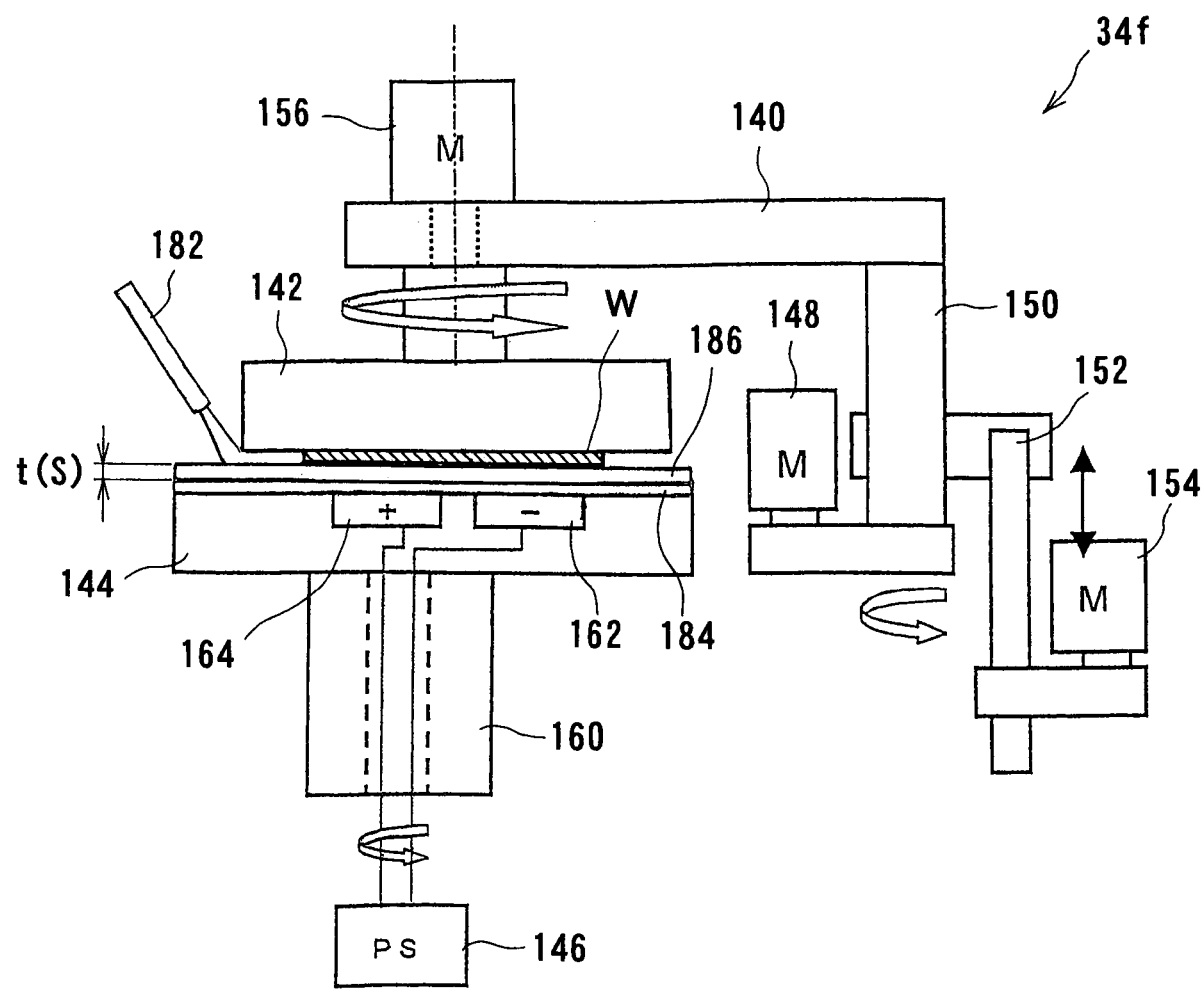
FIG. 18 is a vertical sectional front view schematically showing an electrolytic processing apparatus according to yet another embodiment of the present invention.

FIG. 18 shows an electrolytic processing apparatus 34f according to yet another embodiment of the present invention. The electrolytic processing apparatus 34f shown in FIG. 18 differs from the electrolytic processing apparatus 34e shown in FIG. 17 in that the ion exchanger 184 integrally covering the processing electrodes 162 and the feeding electrodes 164 is mounted on the surface of the electrode section 144, and the insulating spacer 186 is mounted on the surface (upper surface) of the ion exchanger 184.

According to this embodiment, while keeping the surface (lower surface) of the substrate W held by the substrate holder 142 in contact with the surface (upper surface) of the insulating spacer 186 and continuously supplying a liquid between the electrode section 144 and the substrate W, the substrate W and the electrodes (processing electrodes 162 and feeding electrodes 164) are moved relative to each other by the actuations of the substrate-rotating motor 156 and the hollow motor 160, and a voltage is applied between the processing electrodes 162 and the feeding electrodes 164 to carry out electrolytic processing. During the electric processing, the distance S between the substrate W and the ion exchange 184 is kept equal to the thickness t of the insulating spacer 186 (t=S), i.e., not more than 100 µm, preferably not more than 50 µm, more preferably not more than 10 µm, and most preferably not more than 1 µm, without control of the rotational speeds of the substrate-rotating motor 156 and the hollow motor 160.

By thus keeping the distance S between the substrate W and the ion exchanger 184 at a particular value of not more than 100 µm, preferably not more than 50 µm, more preferably not more than 10 µm, most preferably not more than 1 µm, it becomes possible to process the surface of a conductive film having surface irregularities, for example, formed on a substrate such as a semiconductor wafer, to greater flatness while removing the irregularities. Further, since electrolytic processing is carried out without sliding between the ion exchanger 184 and the surface of the substrate W, defects in the surface of the substrate W and wear of the ion exchanger 184 can be prevented.

Though in the above-described embodiments the substrate W and the electrodes (processing electrodes 44 or 162 and feeding electrodes 46 or 164) are moved relative to each other during processing by rotating the substrate holder 42 or 142 and allowing the electrode section 48 or 144 to make a scroll movement, relative movement may be made in other manners. Thus, it is possible to allow at least one of them to make a rotational, eccentrically rotational, translational, reciprocating or scroll movement.

Further, though in the above-described embodiments the processing electrodes 44 or 162 and the feeding electrodes 46 or 164 are embedded in the electrode section 48 or 144, so that the processing electrodes 44 or 162 and the feeding electrodes 46 or 164 do not move relative to each other, it is also possible to provide a processing electrode(s) and a feeding electrode (s) separately so that they are allowed to move relative to each other. In this case, electrolytic processing of a substrate may be carried out by supplying a liquid between the substrate and at least one of the processing electrode and the feeding electrode while moving them relative to each other and controlling the distance therebetween at a predetermined value of, for example, not more than 100 µm. Alternatively, an ion exchanger may be mounted on at least one of the processing electrode and the feeding electrode, and electrolytic processing of a substrate may be carried out by supplying a liquid between the substrate and the electrode(s) on which the ion-exchanger is mounted while moving them relative to each other and controlling the distance between the ion exchanger and the substrate at a predetermined value of not more than 100 µm.

According to the present invention, the surface of a conductive film having surface irregularities, for example, formed on a substrate such as a semiconductor wafer, can be processed to greater flatness while removing the irregularities. Further, when an ion exchanger is employed, processing of a workpiece can be carried out without sliding between the ion exchanger and the workpiece, thereby suppressing the formation of defects in the workpiece surface and wear of the ion exchanger.

Although certain preferred embodiments of the present invention have been shown and described in detail, it should be understood that various changes and modifications may be made thereto without departing from the scope of the appended claims.

What is claimed is:

1. An electrolytic processing method comprising:
    disposing a workpiece, to which electricity is fed from a feeding electrode, and a processing electrode such that they are not in contact with and close to each other at a distance of not more than 10 μm;

supplying a liquid containing an ion-exchange material between the workpiece and at least one of the processing electrode and the feeding electrode so that the liquid flows therebetween, the ion-exchange material having a smaller size than the distance between the workpiece and the at least one of the processing electrode and the feeding electrode, and being present in a particulate or gel-like form in the liquid;

applying a voltage between the processing electrode and the feeding electrode; and moving the workpiece and at least one of the processing electrode and the feeding electrode relative to each other.

2. The electrolytic processing method according to claim 1, wherein the ion-exchange material is contained in the liquid in an amount of 1 to 90% by weight.

3. The electrolytic processing method according to claim 1, wherein a processing product, which has been taken in the ion-exchange material during processing, is removed from the ion-exchange material.

4. The electrolytic processing method according to claim 3, wherein the processing product taken in the ion-exchange material is removed by separating the ion-exchange material from the liquid, and dispersing the separated ion-exchange material in a regeneration liquid.

5. The electrolytic processing method according to claim 3, wherein the processing product taken in the ion-exchange material is removed by applying an electric field to the liquid containing the ion-exchange material.

6. The electrolytic processing method according to claim 1, wherein the liquid is ultrapure water, pure water, a liquid having an electric conductivity of not more than 500 μS/cm, or an electrolyte solution.

* * * * *